United States Patent
Lee

(10) Patent No.: US 9,012,292 B2
(45) Date of Patent: Apr. 21, 2015

(54) SEMICONDUCTOR MEMORY DEVICE AND METHOD OF FABRICATING THE SAME

(76) Inventor: Sang-Yun Lee, Beaverton, OR (US)

( * ) Notice: Subject to any disclaimer, the term of this patent is extended or adjusted under 35 U.S.C. 154(b) by 423 days.

(21) Appl. No.: 13/175,652

(22) Filed: Jul. 1, 2011

(65) Prior Publication Data

US 2012/0003808 A1  Jan. 5, 2012

(30) Foreign Application Priority Data

Jul. 2, 2010 (KR) .................. 10-2009-0063938

(51) Int. Cl.

| | |
|---|---|
| H01L 21/20 | (2006.01) |
| H01L 49/02 | (2006.01) |
| H01L 27/105 | (2006.01) |
| H01L 27/108 | (2006.01) |
| H01L 27/115 | (2006.01) |
| H01L 21/84 | (2006.01) |
| H01L 27/06 | (2006.01) |
| H01L 27/12 | (2006.01) |

(52) U.S. Cl.
CPC .............. *H01L 28/91* (2013.01); *H01L 21/84* (2013.01); *H01L 27/0688* (2013.01); *H01L 27/105* (2013.01); *H01L 27/10808* (2013.01); *H01L 27/1082* (2013.01); *H01L 27/10852* (2013.01); *H01L 27/10894* (2013.01); *H01L 27/10897* (2013.01); *H01L 27/11514* (2013.01); *H01L 27/1207* (2013.01)

(58) Field of Classification Search
None
See application file for complete search history.

(56) References Cited

U.S. PATENT DOCUMENTS

| | | | |
|---|---|---|---|
| 4,704,785 A | 11/1987 | Curran | |
| 4,732,312 A | 3/1988 | Kennedy et al. | |
| 4,829,018 A | 5/1989 | Wahlstrom | |
| 4,854,986 A | 8/1989 | Raby | |
| 5,087,585 A | 2/1992 | Hayashi | |
| 5,106,775 A | 4/1992 | Kaga et al. | |
| 5,152,857 A | 10/1992 | Ito et al. | |
| 5,250,460 A | 10/1993 | Yamagata et al. | |
| 5,266,511 A | 11/1993 | Takao | |
| 5,277,748 A | 1/1994 | Sakaguchi et al. | |
| 5,324,980 A | 6/1994 | Kusunoki | |
| 5,355,022 A | 10/1994 | Sugahara et al. | |
| 5,371,037 A | 12/1994 | Yonehara | |
| 5,374,564 A | 12/1994 | Bruel | |
| 5,374,581 A | 12/1994 | Ichikawa et al. | |
| 5,554,870 A | 9/1996 | Fitch et al. | |
| 5,563,084 A | 10/1996 | Ramm et al. | |
| 5,617,991 A | 4/1997 | Pramanick et al. | |
| 5,695,557 A | 12/1997 | Yamagata et al. | |
| 5,854,123 A | 12/1998 | Sato et al. | |
| 5,882,987 A | 3/1999 | Srikrishnan | |
| 5,937,312 A | 8/1999 | Iyer et al. | |
| 5,980,633 A | 11/1999 | Yamagata et al. | |
| 5,998,808 A | 12/1999 | Matsushita | |
| 6,057,212 A | 5/2000 | Chan et al. | |
| 6,103,597 A | 8/2000 | Aspar et al. | |
| 6,153,495 A | 11/2000 | Kub et al. | |

(Continued)

*Primary Examiner* — Seahvosh Nikmanesh
(74) *Attorney, Agent, or Firm* — Greg L Martinez

(57) ABSTRACT

A method for fabricating semiconductor memory device, includes providing a semiconductor substrate; forming a lower region which includes a first data storage device, which is carried by the semiconductor substrate; forming a switching device which is carried by the first data storage device; and forming an upper region which includes a second data storage device, which is carried by the switching device. The step of forming the first storage device includes forming a first electrode having a cylindrical or pillar shape, the first electrode being connected to the switching device.

20 Claims, 37 Drawing Sheets

(56) References Cited

U.S. PATENT DOCUMENTS

| | | |
|---|---|---|
| 6,222,251 B1 | 4/2001 | Holloway |
| 6,229,161 B1 | 5/2001 | Nemati et al. |
| 6,242,324 B1 | 6/2001 | Kub et al. |
| 6,331,468 B1 | 12/2001 | Aronowitz et al. |
| 6,380,046 B1 | 4/2002 | Yamazaki |
| 6,380,099 B2 | 4/2002 | Sakaguchi et al. |
| 6,417,108 B1 | 7/2002 | Akino et al. |
| 6,423,614 B1 | 7/2002 | Doyle |
| 6,534,382 B1 | 3/2003 | Sakaguchi et al. |
| 6,555,901 B1 | 4/2003 | Yoshihara et al. |
| 6,600,173 B2 | 7/2003 | Tiwari |
| 6,630,713 B2 | 10/2003 | Geusic |
| 6,635,552 B1 | 10/2003 | Gonzalez |
| 6,638,834 B2 | 10/2003 | Gonzalez |
| 6,653,209 B1 | 11/2003 | Yamagata |
| 6,661,085 B2 | 12/2003 | Kellar et al. |
| 6,762,076 B2 | 7/2004 | Kim et al. |
| 6,774,010 B2 | 8/2004 | Chu et al. |
| 6,806,171 B1 | 10/2004 | Ulyashin et al. |
| 6,809,009 B2 | 10/2004 | Aspar et al. |
| 6,844,243 B1 | 1/2005 | Gonzalez |
| 6,864,534 B2 | 3/2005 | Ipposhi et al. |
| 6,943,067 B2 | 9/2005 | Greenlaw |
| 6,995,430 B2 | 2/2006 | Langdo et al. |
| 7,052,941 B2 | 5/2006 | Lee |
| 7,067,396 B2 | 6/2006 | Aspar et al. |
| 7,078,739 B1 | 7/2006 | Nemati et al. |
| 7,109,092 B2 | 9/2006 | Tong |
| 7,148,119 B1 | 12/2006 | Sakaguchi et al. |
| RE39,484 E | 2/2007 | Bruel |
| 7,217,636 B1 | 5/2007 | Atanackovic |
| 7,245,002 B2 | 7/2007 | Akino et al. |
| 7,256,104 B2 | 8/2007 | Ito et al. |
| 7,378,702 B2 | 5/2008 | Lee |
| 7,470,142 B2 | 12/2008 | Lee |
| 7,470,598 B2 | 12/2008 | Lee |
| 7,632,738 B2 | 12/2009 | Lee |
| 7,633,162 B2 | 12/2009 | Lee |
| 7,671,371 B2 | 3/2010 | Lee |
| 7,709,932 B2 | 5/2010 | Nemoto et al. |
| 7,718,508 B2 | 5/2010 | Lee |
| 7,799,675 B2 | 9/2010 | Lee |
| 7,800,199 B2 | 9/2010 | Oh et al. |
| 7,846,814 B2 | 12/2010 | Lee |
| 7,867,822 B2 | 1/2011 | Lee |
| 7,888,764 B2 | 2/2011 | Lee |
| 2002/0025604 A1 | 2/2002 | Tiwari |
| 2003/0102079 A1 | 6/2003 | Kalvesten et al. |
| 2003/0119279 A1 | 6/2003 | Enquist |
| 2003/0205480 A1 | 11/2003 | Sakaguchi et al. |
| 2003/0224582 A1 | 12/2003 | Shimoda et al. |
| 2004/0147077 A1 | 7/2004 | Watanabe et al. |
| 2004/0259312 A1 | 12/2004 | Schlosser et al. |
| 2005/0280154 A1 | 12/2005 | Lee |
| 2005/0280155 A1 | 12/2005 | Lee |
| 2005/0280156 A1 | 12/2005 | Lee |
| 2006/0121690 A1 | 6/2006 | Pogge et al. |
| 2006/0275962 A1 | 12/2006 | Lee |
| 2007/0072391 A1 | 3/2007 | Pocas et al. |
| 2007/0190746 A1 | 8/2007 | Ito et al. |
| 2007/0262457 A1 | 11/2007 | Lin |
| 2008/0032463 A1 | 2/2008 | Lee |
| 2008/0048327 A1 | 2/2008 | Lee |
| 2009/0267233 A1 | 10/2009 | Lee |
| 2010/0038743 A1 | 2/2010 | Lee |
| 2010/0133695 A1 | 6/2010 | Lee |
| 2010/0190334 A1 | 7/2010 | Lee |
| 2011/0001172 A1 | 1/2011 | Lee |
| 2011/0003438 A1 | 1/2011 | Lee |
| 2011/0053332 A1 | 3/2011 | Lee | ize
SEMICONDUCTOR MEMORY DEVICE AND METHOD OF FABRICATING THE SAME

CROSS-REFERENCE TO RELATED APPLICATIONS

This patent application claims priority to Korean Patent Application No. 10-2009-63938, which was filed on Jul. 2, 2010, by the same inventor, the contents of which are incorporated by reference as though fully set forth herein.

BACKGROUND OF THE INVENTION

1. Field of the Invention

This invention relates to semiconductor circuitry formed using bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat. No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati, U.S. Pat. No. 7,078,739 to Nemati. It should be noted that U.S. Pat. No. 5,554,870 to Fitch, U.S. Pat. No. 6,229,161 to Nemati and U.S. Pat. No. 7,078,739 to Nemati disclose the formation of both horizontal and vertical semiconductor devices on a single major surface of a substrate.

It is desirable to provide computer chips that can operate faster so that they can process more data in a given amount of time. The speed of operation of a computer chip is typically measured in the number of instructions in a given amount of time it can perform. Computer chips can be made to process more data in a given amount of time in several ways. For example, they can be made faster by decreasing the time it takes to perform certain tasks, such as storing and retrieving information to and from the memory chip. The time needed to store and retrieve information to and from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are generally not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. Further, the yield of the computer chips fabricated in a run decreases as their area increases, which increases the overall cost.

Instead of embedding the memory devices on the same surface as the other devices, the memory chip can be bonded to the computer chip to form a stack, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using high pitch conductive interconnects which extend therebetween. Examples of 3-D ICs are disclosed in U.S. Pat. Nos. 5,087,585, 5,308,782, 5,355,022, 5,915,167, 5,998,808 and 6,943,067.

There are several problems, however, with using 3-D packages and 3-D ICs. One problem is that the use of wire bonds increases the access time between the computer and memory chips because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. These chips need to be properly aligned with each other and the interconnects because the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions. It is also very difficult to fabricate high pitch conductive interconnects.

Some references disclose forming an electronic device, such as a dynamic random access memory (DRAM) capacitor, by crystallizing polycrystalline and/or amorphous semiconductor material using a laser. One such electronic device is described in U.S. patent Application No. 20040131233 to Bhattacharyya. The laser is used to heat the polycrystalline or amorphous semiconductor material to form a single crystalline semiconductor material. However, a disadvantage of this method is that the laser is capable of driving the temperature of the semiconductor material to be greater than 800 degrees Celsius (° C.). In some situations, the temperature of the semiconductor material is driven to be greater than about 1000 (° C.). It should be noted that some of this heat undesirably flows to other regions of the semiconductor structure proximate to the DRAM capacitor, which can cause damage.

Accordingly, it is highly desirable to provide a new method for forming electronic devices using wafer bonding which is cost effective and reliable, and can be done at low temperature.

BRIEF SUMMARY OF THE INVENTION

The present invention involves a semiconductor circuit structure, and a method of forming the semiconductor circuit structure. The invention will be best understood from the following description when read in conjunction with the accompanying drawings.

DETAILED DESCRIPTION OF THE INVENTION

A method for fabricating semiconductor memory device is provided. The method for fabricating semiconductor memory device is comprising: providing a semiconductor substrate; forming lower region first data storage devices on the semiconductor substrate; forming switching devices on the first data storage devices; forming upper region second data storage devices on the switching devices; wherein forming the first and second data storage devices comprises; forming first electrodes in cylinder or pillar shape to be connected to the switching devices. More information regarding the method disclosed herein can be found in U.S. patent application Ser. Nos. 12/581,722, 12/874,866 and 12/847,374, by the same inventor, the contents of which are incorporated by reference as though fully set forth herein.

More information regarding some of the steps disclosed herein can be found in U.S. Pat. Nos. 7,052,941, 7,378,702, 7,470,142, 7,470,598, 7,632,738, 7,633,162, 7,671,371, 7,718,508, 7,799,675, 7,800,199, 7,846,814, 7,867,822, 7,888,764, the contents of which are incorporated by reference as though fully set forth herein. More information regarding some of the steps disclosed herein can be found in U.S. Patent Application Nos. 20050280154, 20050280155, 20050280156, 20060275962, 20080032463, 20080048327, 20090267233, 20100038743, 20100133695, 20100190334, 20110001172, 20110003438 and 20110053332, the contents of which are incorporated by reference as though fully set forth herein.

More information regarding some of the steps disclosed herein can be found in U.S. Pat. Nos. 5,250,460, 5,277,748, 5,374,564, 5,374,581, 5,695,557, 5,854,123, 5,882,987, 5,980,633, 6,103,597, 6,380,046, 6,380,099, 6,423,614, 6,534,382, 6,638,834, 6,653,209, 6,774,010, 6,806,171, 6,809,009, 6,864,534, 7,067,396, 7,148,119, 7,256,104, RE39,484, as well as in U.S. Patent Application Nos. 20030205480, 20030224582 and 20070190746, the contents of which are incorporated by reference as though fully set forth herein.

Figure 1A:
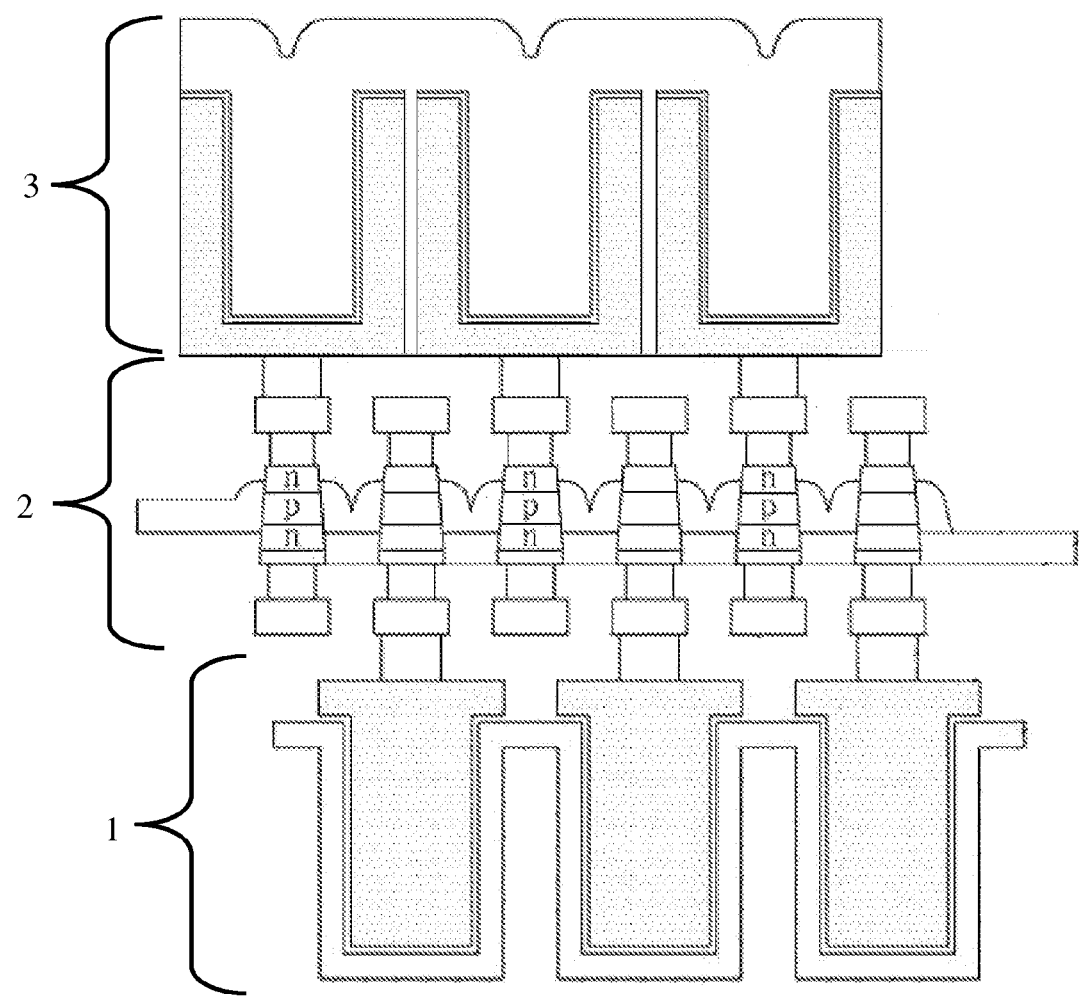
FIGS. 1a and 1b are sectional views of a semiconductor device.
Figure 1B:
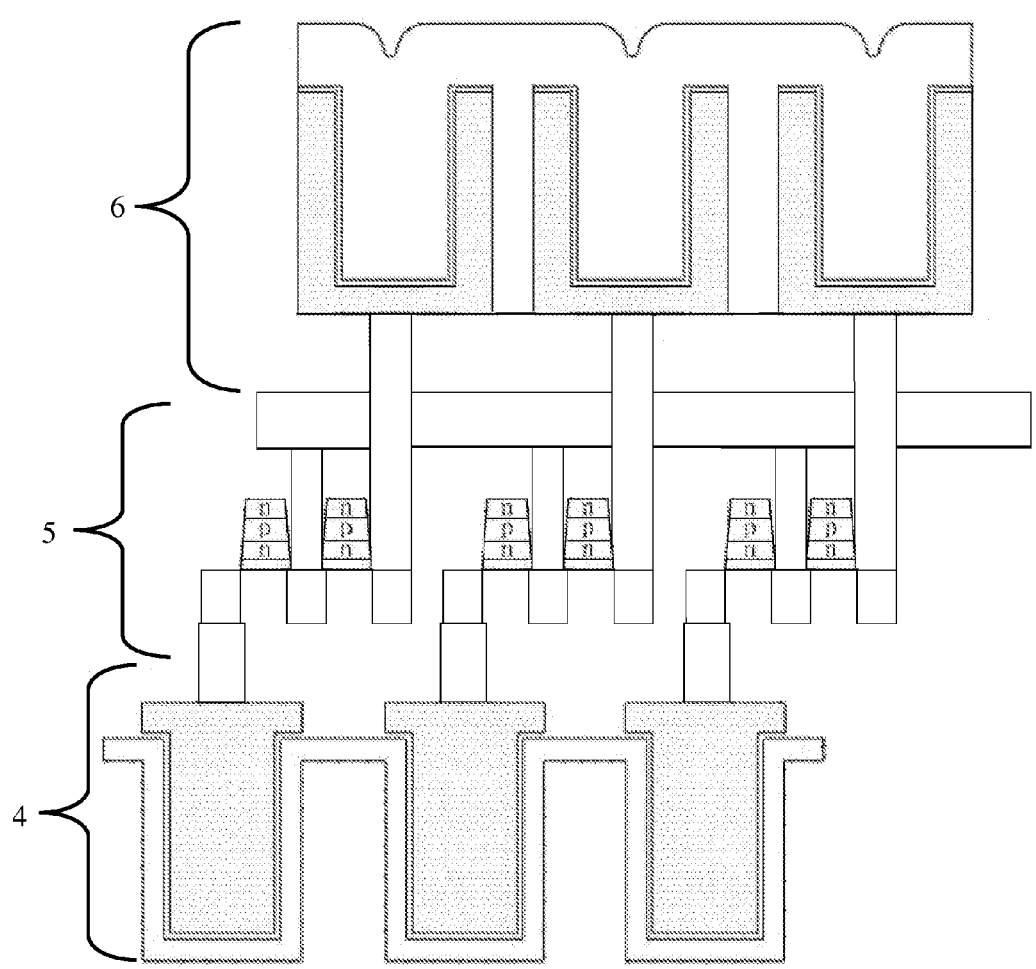

FIGS. 1a and 1b are sectional views of a semiconductor device. The semiconductor memory device includes first storage devices 1, 4 which are formed on the semiconductor substrate; first switching devices 2, 5 which are formed on the first storage devices 1, 4; and second storage devices 3, 6 which are formed on the first switching devices 2, 5.

The semiconductor memory device further includes, third storage devices (not illustrated) below the first storage devices 1, 4 or above the second storage devices 3, 6; second switching devices (not illustrated); and fourth storage devices (not illustrated).

Each of the first, second, third and fourth storage devices can be formed to include a first conductor, dielectric layer and a second conductor.

The first switching devices 2, 5 can be formed vertically as shown in FIG. 1a or horizontally as shown in FIG. 1b.

FIGS. 2a to 2d illustrate combinations of shapes of forms of the storage devices in accordance with an embodiment of this invention. As illustrated in FIGS. 2a to 2d, the first, second, third and fourth storage devices can be formed in pillar or cylinder shapes.

Figure 2A:
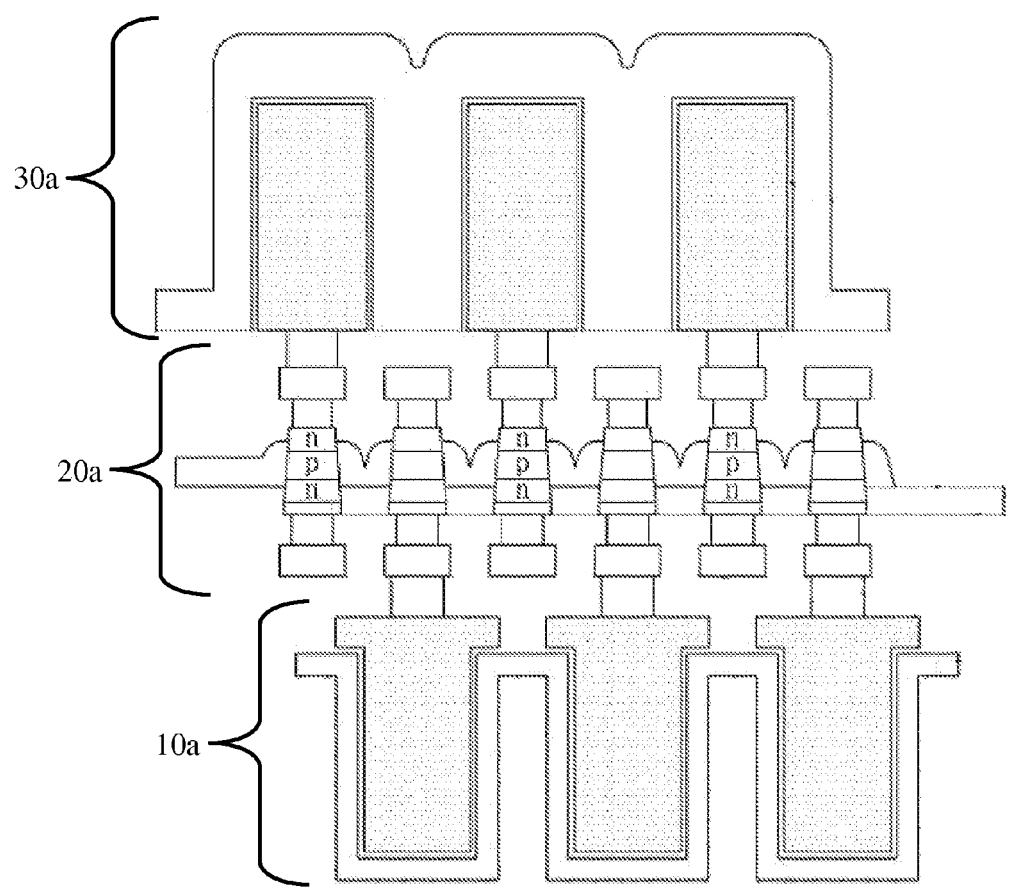
FIGS. 2a to 2d are sectional views of a combination of forming storage device.
Figure 2B:
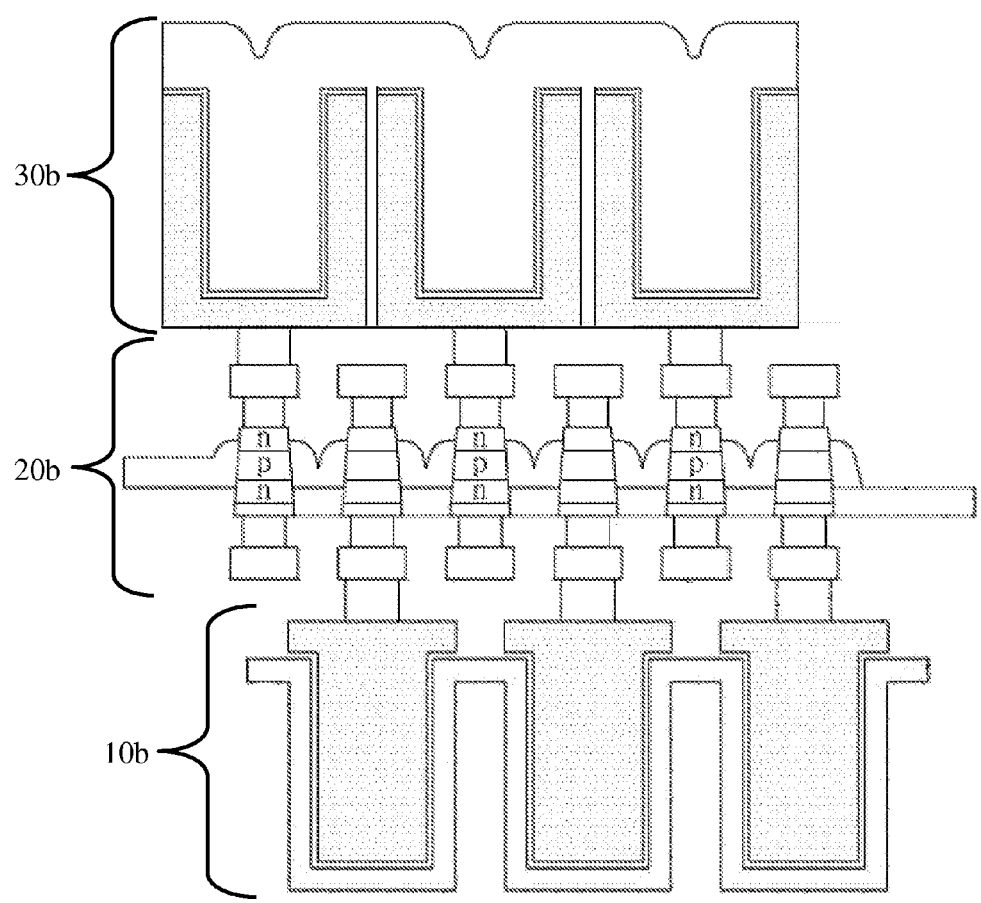
Figure 2C:
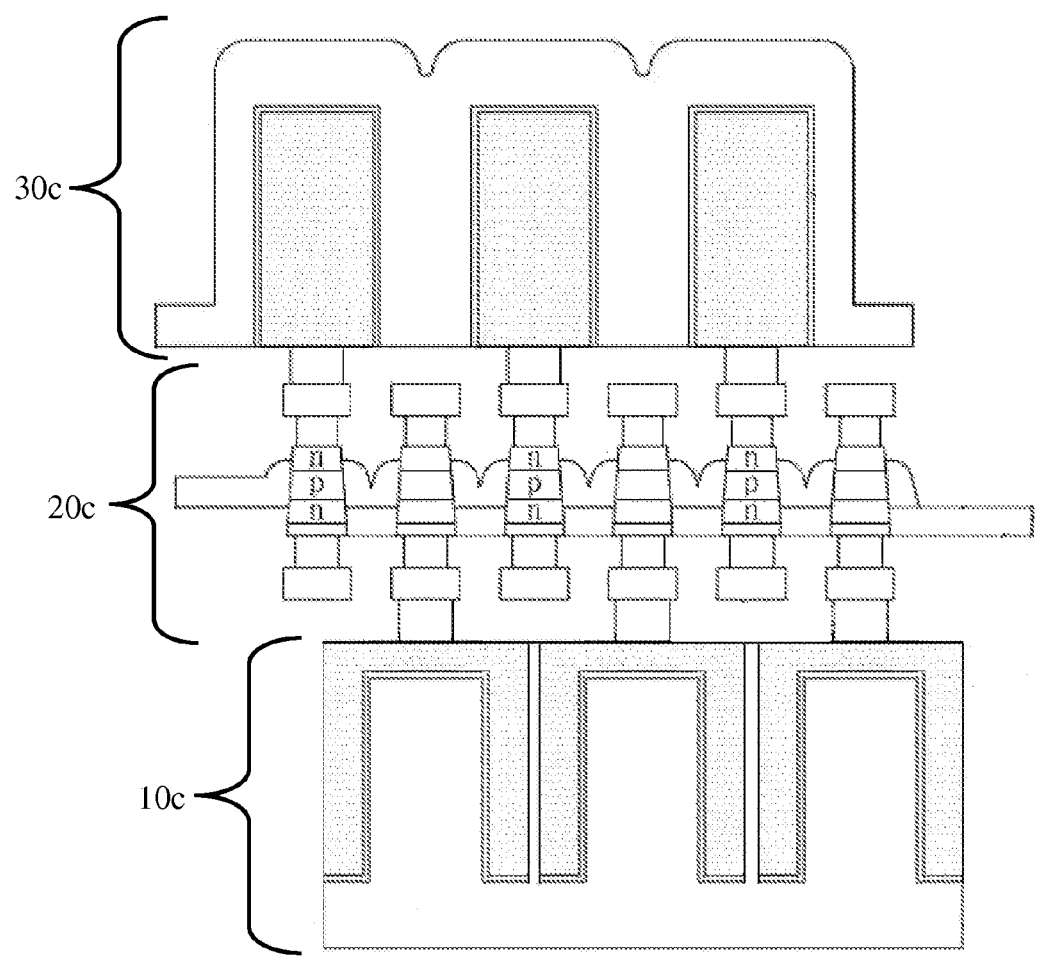
Figure 2D:
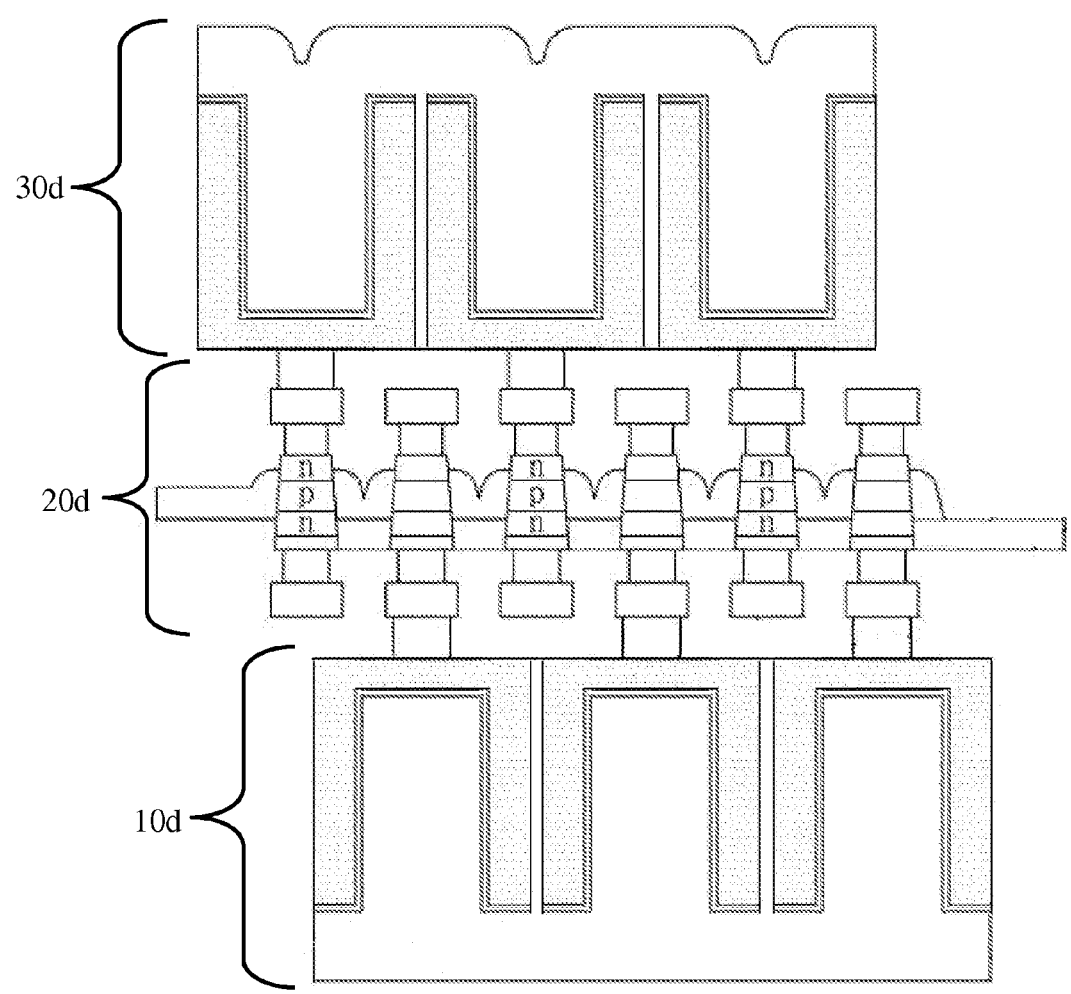

FIG. 2a illustrates a structure formed with combination of the pillar shape first storage devices 10a and the pillar shape second storage devices 20a. FIG. 2b illustrates a structure formed with combination of the first pillar shape storage devices 10b and the second cylinder shape storage devices 20b. FIG. 2c illustrates a structure formed with the cylinder shape first storage devices 10c and the pillar shape storage devices 20c. And, FIG. 2d illustrates a structure formed with combination of the first cylinder shape storage devices 10d and the second cylinder shape storage devices 20d. The first switching devices 20a, 20b, 20c, 20d are included to all of four structures.

FIGS. 3a to 3g are sectional views of steps in forming pillar shape storage devices in accordance with an embodiment of this invention.

Figure 3A:
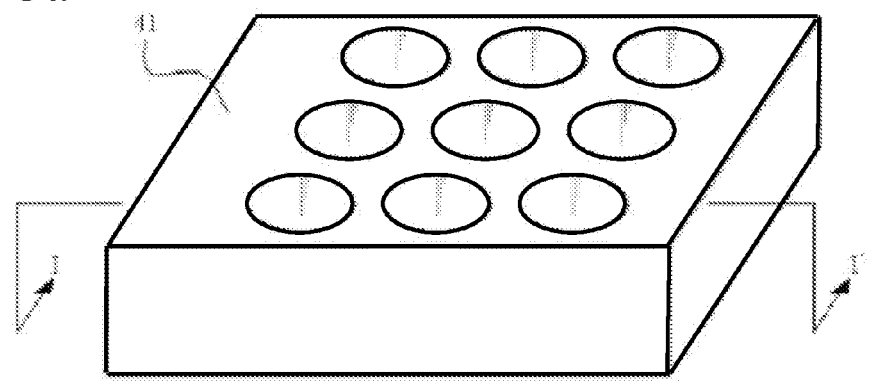
FIGS. 3a to 3h are sectional views of steps in forming pillar shape storage devices.

As illustrated in FIG. 3a, pillar shape patterns are formed on the semiconductor substrate 41 in order to forming lower region data storage devices by depositing insulator film or poly silicon film and then performing photolithography/etching processes.

Figure 3B:
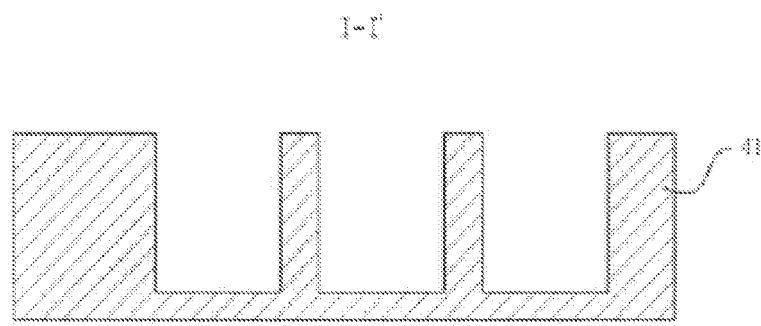

Then, as shown in FIG. 3b, a first conductor 42 is formed by depositing refractory metal or poly silicon film on the pillar shape patterns, and then a dielectric film 43 is formed on the first conductor 42.

Figure 3C:
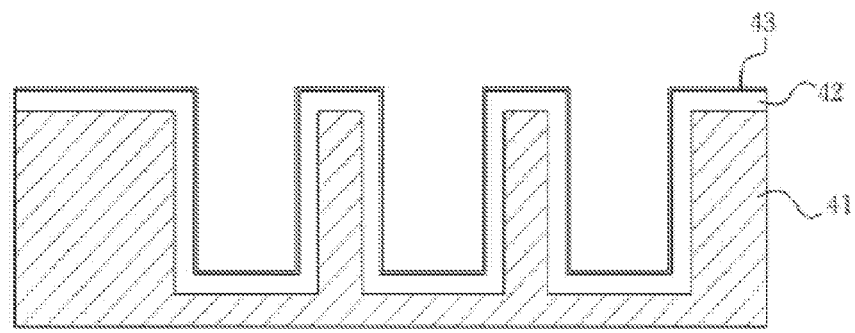

As shown in FIG. 3c, refractory metal or poly silicon film is deposited on the dielectric film 43, and then refractory metal or the poly silicon film is planarized to form a second conductor (capacitor storage node) 44.

Figure 3D:
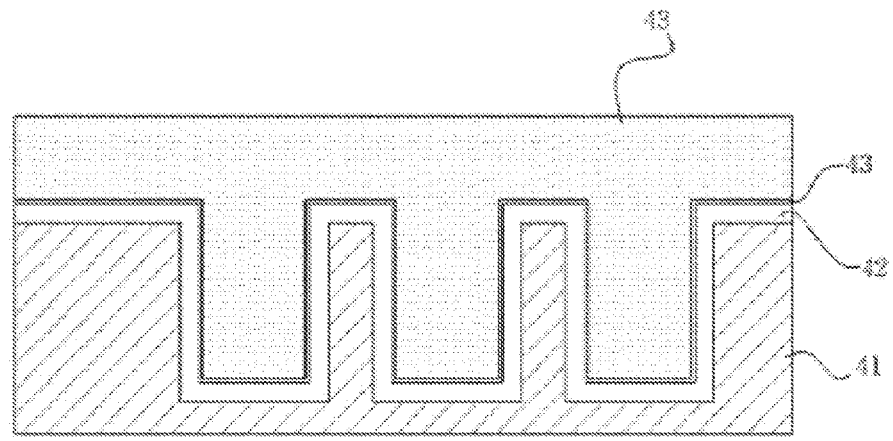
Figure 3E:
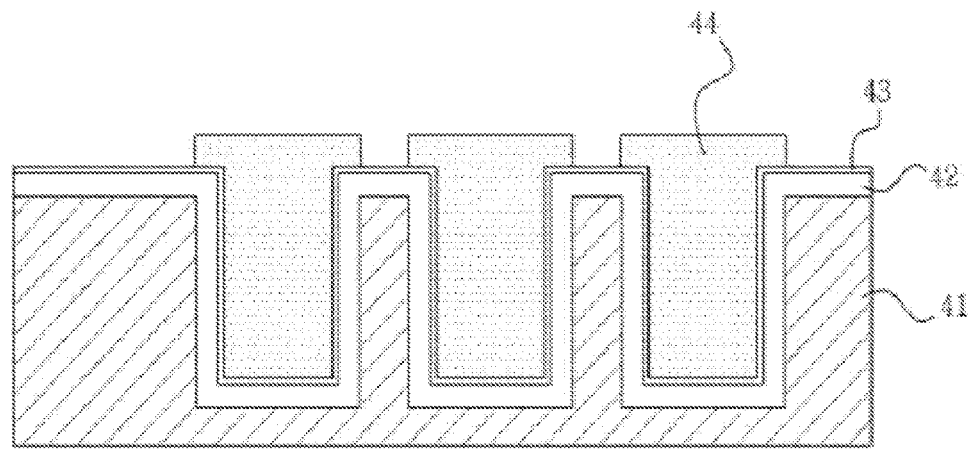

As shown in FIG. 3d, the second conductor (capacitor storage node) 44 is photolithography/etched to separate the second conductor 44. Top of the second conductor 44 is processed to have enough area to allow enough alignment margin to following process steps which are contact photolithography and etching processes.

Next step is depositing insulation film 45 on the second conductor 45 with a pre-defined thickness.

Figure 3F:
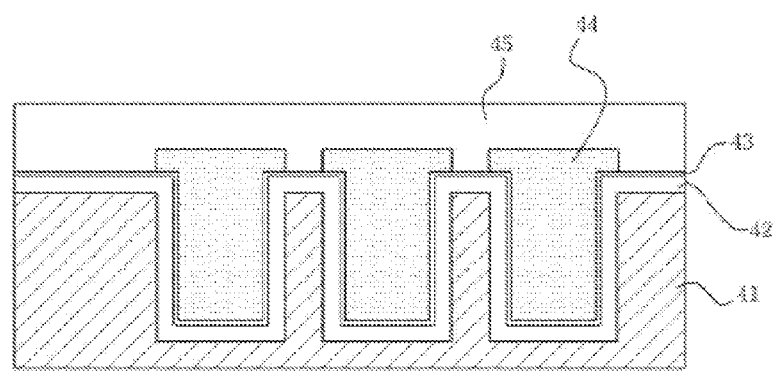

As illustrated in FIG. 3f, contact holes are formed in the insulation film 45 to expose the second conductor 44, and then bit line for upper region storage devices 46, bonding layer 51, switching devices 52, bit line for lower region storage devices 53 is formed.

Figure 3G:
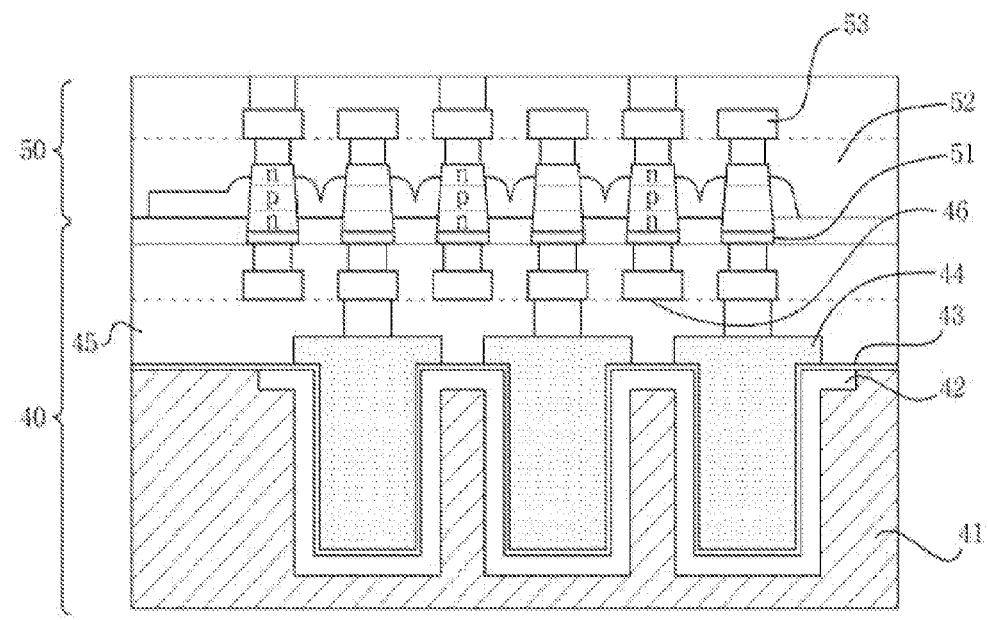
Figure 3H:
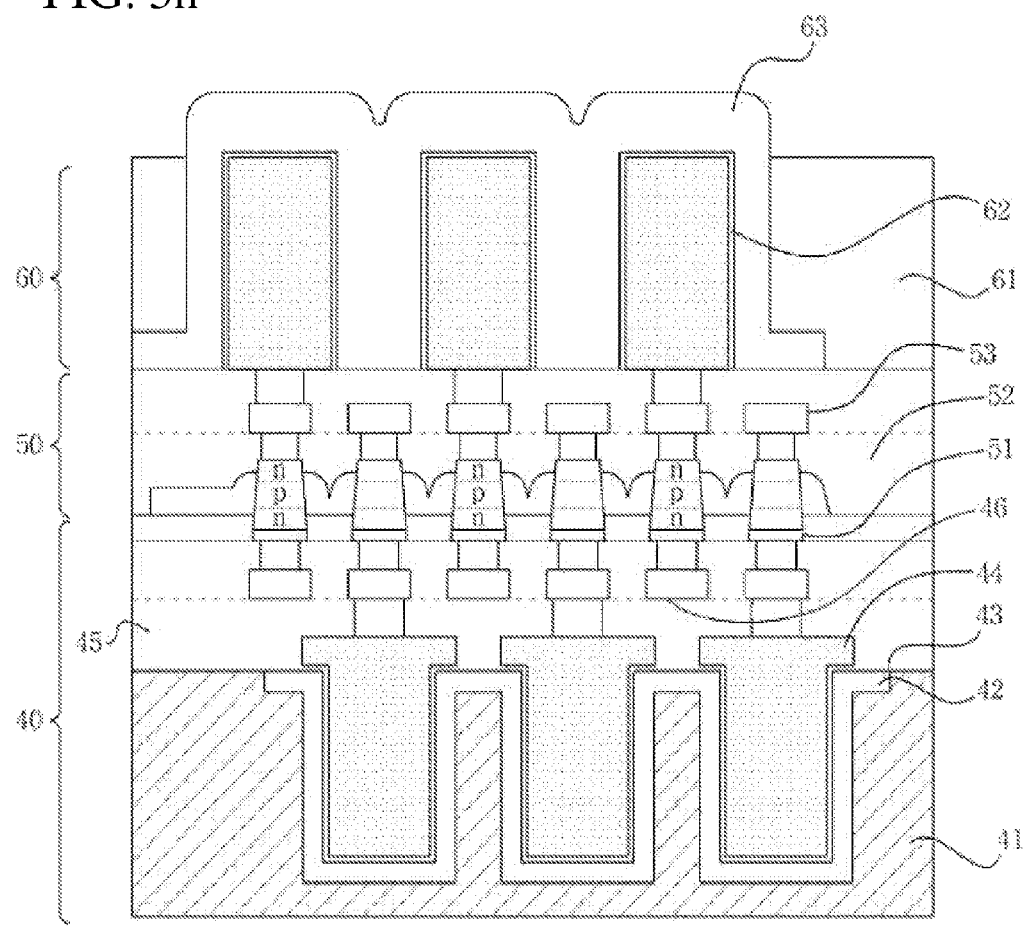

As shown in FIG. 3g, the upper region storage devices 60 are formed on the formed structure as shown in FIG. 3f. The method of forming the upper region storage devices will be described in description of an embodiment of this invention.

FIGS. 4a to 4i are sectional views of steps in forming cylinder shape lower region storage devices in accordance with an embodiment of this invention.

Figure 4A:
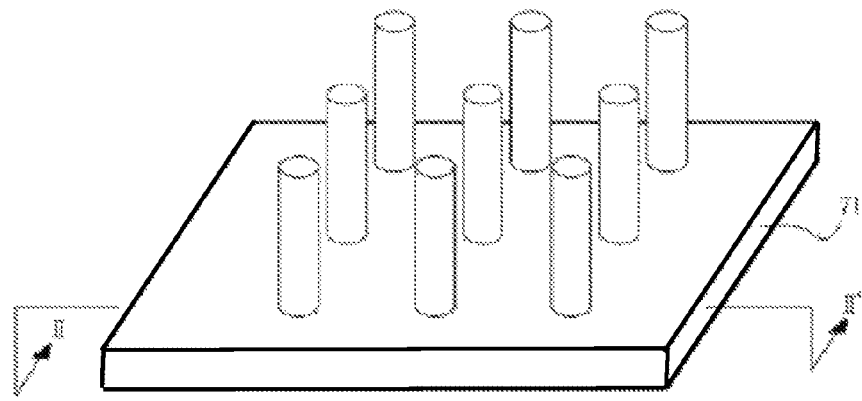
FIGS. 4a to 4j are sectional views of steps in forming cylinder shape storage devices.

As illustrated in FIG. 4a, cylinder shape patterns are formed on the semiconductor substrate 71 in order to forming lower region data storage devices by depositing insulator film or poly silicon film and then performing photolithography/etching processes.

Figure 4B:
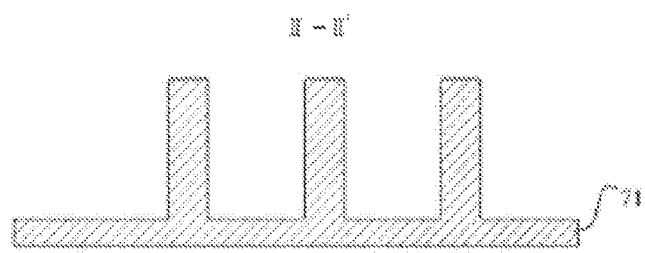

Then, as shown in FIG. 4b, a first conductor 72 is formed by depositing refractory metal or poly silicon film on the pillar shape patterns, and then a dielectric film 73 is formed on the first conductor 72.

Figure 4C:
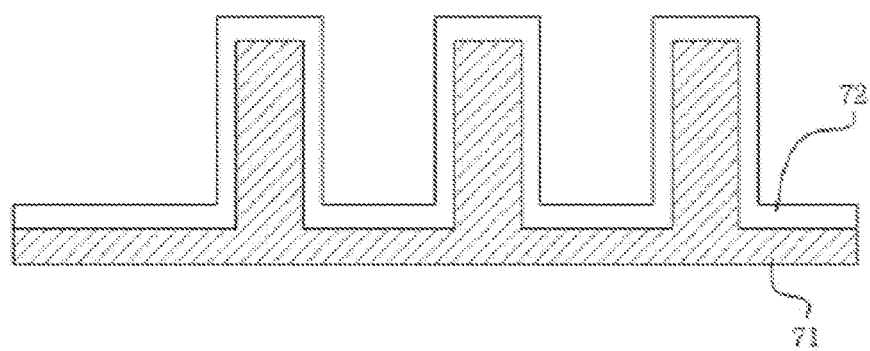

As shown in FIG. 4c, refractory metal or poly silicon film is deposited on the dielectric film 73 to form a second conductor (capacitor storage node) 74.

Figure 4D:
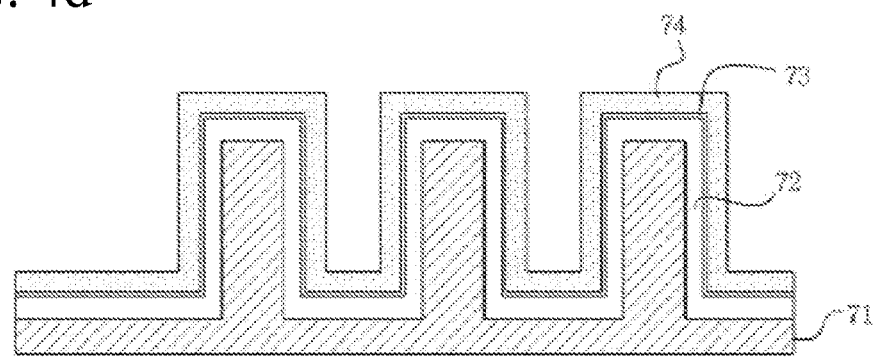

As shown in FIG. 4d, the second conductor (capacitor storage node) 74 is photolithography/etched to separate the second conductor 44. A spacer etching process is performed to separate bottom of the second conductors 74. The dielectric film used for the storage devices can be formed with Atomic Layer Deposition (ALD) films such as Al2O3, HfO2 and ZrO2 which have good etch selectivity to the conductor material (refractory metal or poly silicon).

Figure 4E:
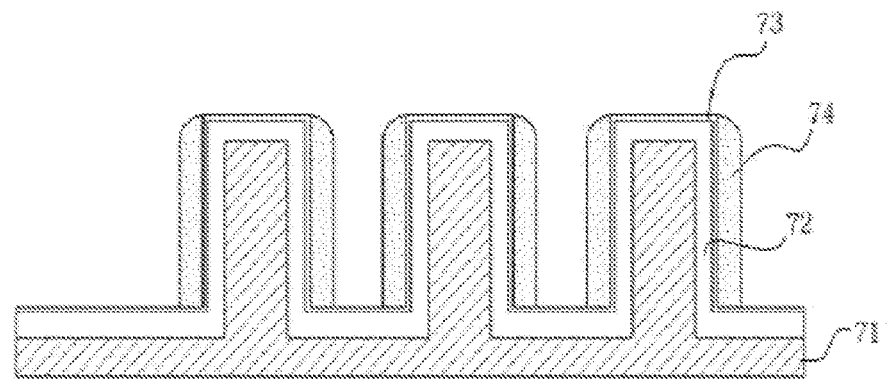

As shown in FIG. 4e, a pre-defined thickness of insulation film 75 is deposited on the second conductor 74 and then planarized by combination of CMP and etch back processes. In this step, part of the spacers, which are conductor material and formed as spacer as shown in FIG. 4d, can be exposed so that they can be connected at third conductor deposition process.

Figure 4F:
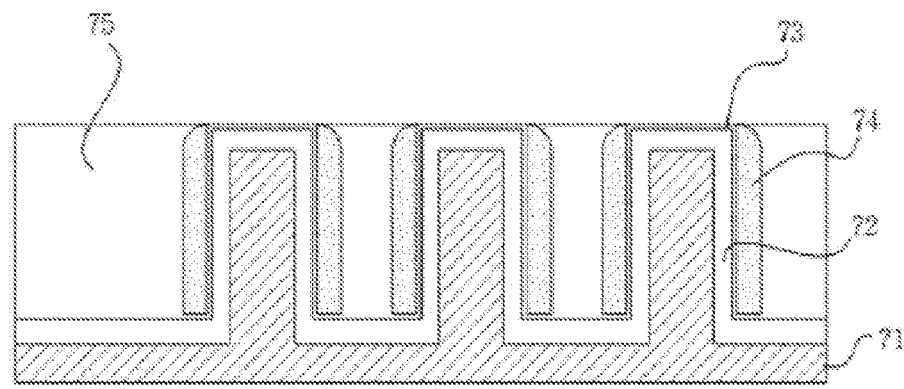

As shown in FIG. 4f, a third conductors 76 are formed.

Figure 4G:
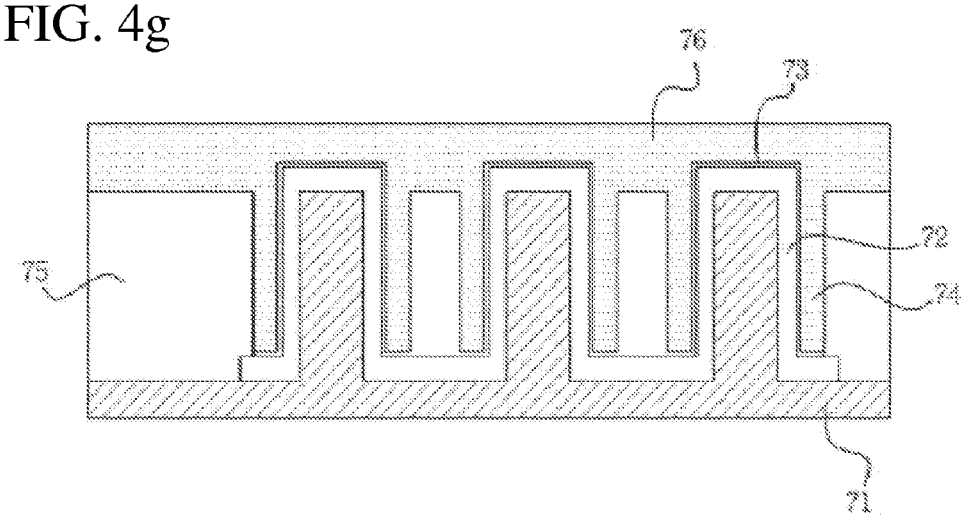

As shown in FIG. 4g, the third conductors 76 are separated by photolithography and etching processes. Top of the third conductor 76 is processed to have enough area to allow enough alignment margin to following process steps which are contact photolithography and etching processes.

Figure 4H:
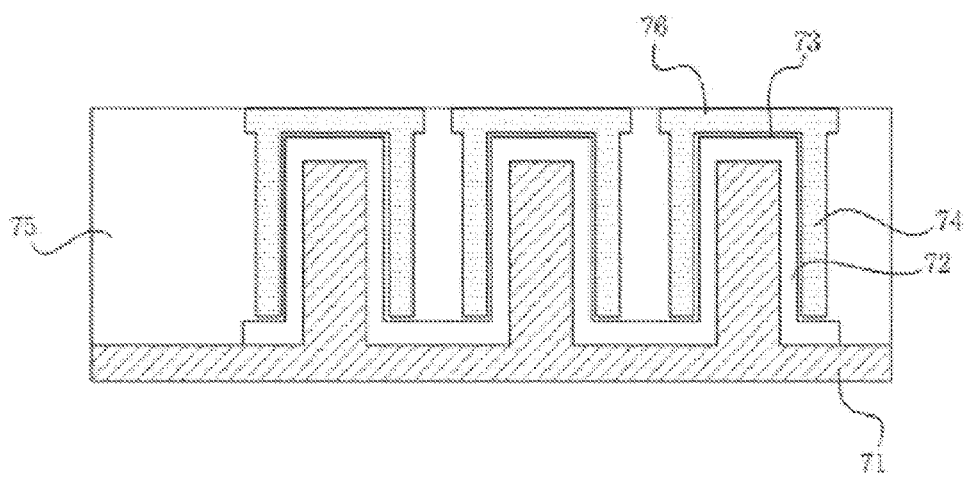

As illustrated in FIG. 4h, contact holes are formed in the insulation film to expose the third conductor 76, and then bit line for upper region storage devices 77, bonding layer 81, switching devices 82, bit line for lower region storage devices 83 is formed.

Figure 4I:
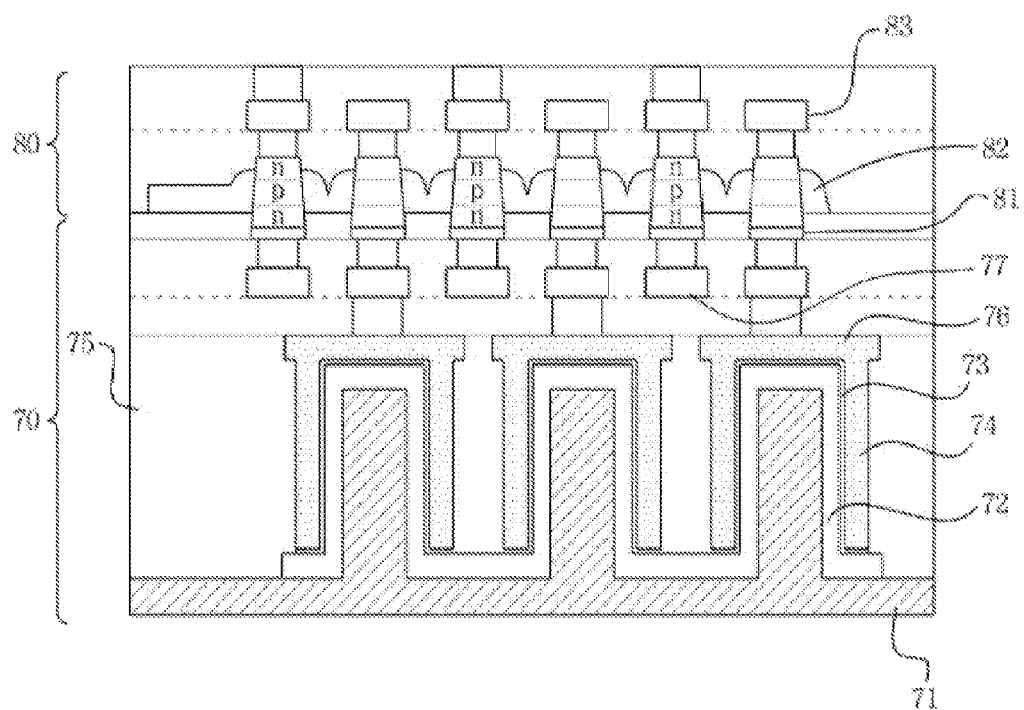
Figure 4J:
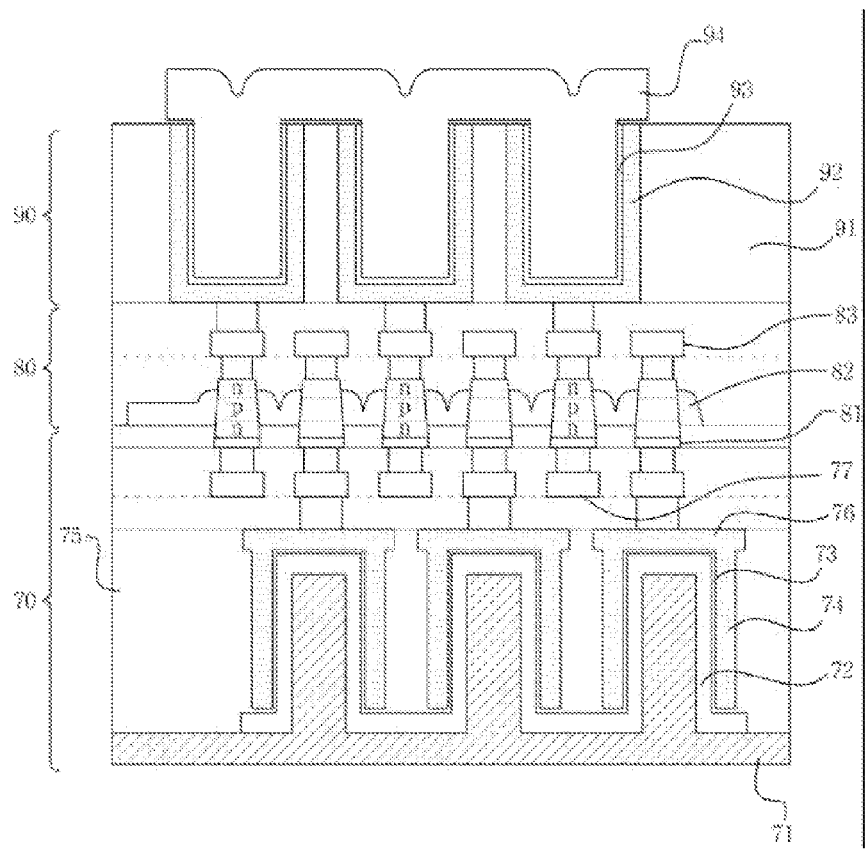

As shown in FIG. 4i, the upper region storage devices 90 are formed on the formed structure as shown in FIG. 4f. The method of forming the upper region storage devices will be described in description of an embodiment of this invention.

FIGS. 5a to 5k are sectional views of steps in forming a semiconductor memory device in accordance with a first embodiment of this invention.

Figure 5A:
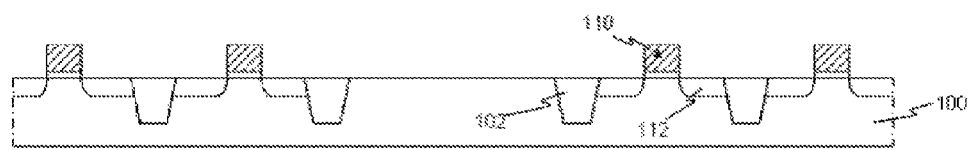
FIGS. 5a to 5k are sectional views of steps in forming a semiconductor memory device.

In FIG. 5a, logic devices are formed on a first semiconductor substrate 100. Specifically, the logic devices can be comprised of NMOS and PMOS transistors 110, 112, resisters (not illustrated), diodes(not illustrated) and wirings (not illustrated) on the first semiconductor substrate 100.

More specifically, isolation films 102 are formed in the first semiconductor substrate 100 to define active regions. The first semiconductor substrate 100 can be bulk silicon, bulk silicon-germanium, or silicon or silicon-germanium epitaxial layer grown on the bulk silicon or bulk silicon-germanium substrate. Also, the first semiconductor substrate 100 can include silicon-on-sapphire (SOS), silicon-on-insulator (SOI), thin film transistor (TFT), doped or undoped semiconductors, silicon epitaxial layer on the base semiconductor substrate, or any other semiconductor materials that are well known to those skilled in the art.

The isolation films 201 can be formed by forming trenches in the first semiconductor substrate 100 and then fill in the trenches with insulation films such as High Density Plasma (HDP) oxide.

Well regions, in which the NMOS and PMOS transistors are formed, can be formed in a pre-defined region in the first semiconductor substrate 100. The well regions can be formed by ion-implanting dopants into the surface of the first semiconductor substrate 100.

After defining active regions in the first semiconductor substrate 100, gate dielectric and gate conductor are deposited and patterned to form gate conductors 110. After forming the gate conductors 110, dopants are ion-implanted to each side of the gate conductors 110 into the first semiconductor substrate 100 to form source/drain regions 112. This completes transistors on the first semiconductor substrate 100.

Figure 5B:
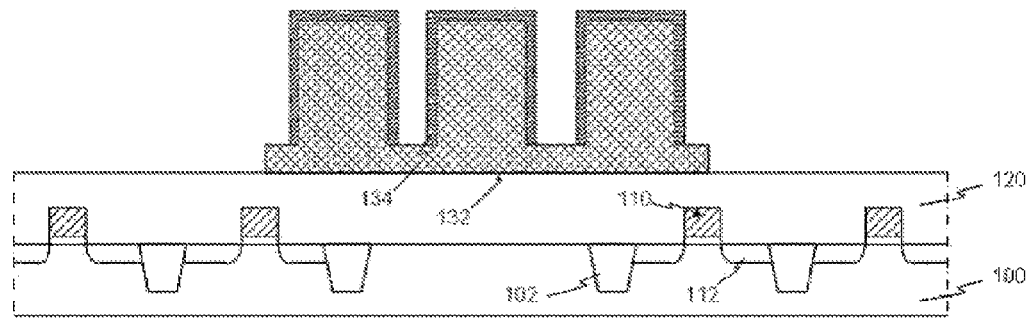

In FIG. 5b, a first interlayer insulation film 120 is formed by depositing insulation film with good step coverage on the transistors. Resistors (not illustrated), diodes (not illustrated), and wirings (not illustrated) can be included in the first interlayer insulation film 120.

As a following step, lower region storage devices are formed on the first interlayer insulation film 120 in which the logic devices are included. In one embodiment of this invention, the lower region data storage devices can be formed as capacitors. Also, the lower region data storage devices can be formed as storage devices using phase-shift storage devices. Again, the lower region data storage devices can be also formed as ferroelectric memory device which is using ferroelectric characteristics of the material.

In case of using the capacitors as data storage devices, the capacitors can be formed in variety of shapes such as stack type, pillar type and cylinder type. In stack type capacitors, first and second conductors can be stacked face to face. In pillar type capacitors case, first conductor can be formed in pillar shape and then second conductor can be formed on the outer surface of the first conductor conformal. And in cylinder type capacitors case, first conductor can be formed in cylinder shape, and then second conductor can be formed conformal to the inner wall of the first conductors. The steps of forming the cylinder type capacitors 132, 134 will be described in accordance with an embodiment of this invention.

Specifically, the first conductors 132, which are plate conductors, are formed on the first interlayer insulation film 120 in which logic devices are buried in. More specifically, enough thickness of conductor film is deposited on the first interlayer insulation film 120, and then the conductor film is photolithography/etched to form the first conductors 132 in pillar shape which have connected bottom to each other.

After forming the first conductors 132, a dielectric film (not illustrated) and conductor film for the second conductor are deposited conformal. The conductor film for the second conductor 132 are etched to separate the conductor film for the second conductor from the second conductors 134. Specifically, the second conductors 134 can be formed to be separated each other as well as cover the surface of the pillar shape first conductors 132. The second conductors 134 also can be formed in cylinder shape which has open bottom as storage node conductor.

When the bottom region capacitors 132, 134 are formed, the first and second conductors can be formed with poly silicon or metal, and the dielectric film (not illustrated) can be formed with single layer of tantalum oxide (Ta2O5) or aluminum oxide (Al2O3) or stacked film of tantalum oxide/titanium oxide or aluminum oxide/titanium oxide.

Figure 5C:
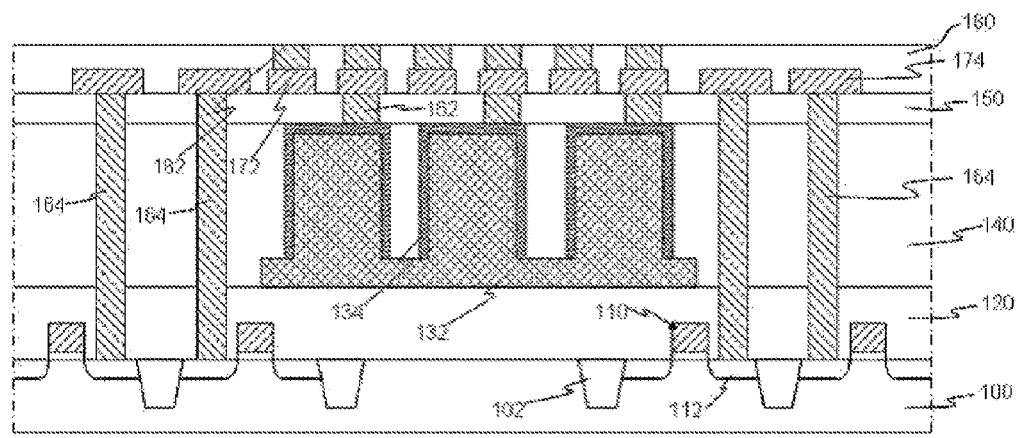

As shown in FIG. 5c, after forming the capacitors 132, 134, an insulation film such as oxide film is deposited all over the surface. A second interlayer insulation film 140, 150 are formed by planarization process such as chemical-mechanical polishing (CMP) or etch-back processes.

In next steps, contact plugs 162 for lower region storage node which are individually connected to the second conductors 134 and contact plugs 164 for the first logic which are connected to the transistors (logic devices in the lower region) are formed. Conductor lines 174 are formed on the contact plugs 162, 164. At this time, conductor lines can be also formed on the capacitors 132, 134 as not connected to the contact plugs for the lower region storage node. The conductor lines which are not connected to the contact plugs 162 for the lower region storage nodes are bit lines 172 which will be connected to the switching devices which will be formed at following process steps. Specifically, the bit lines 172 and conductor lines 174 can be formed alternatively in order on the capacitors 132, 134.

Next, a third interlayer insulation film is formed 180 which covers the bit lines 172 and conductor lines 174, and contact plugs 182 are formed which are electrically connected to the bit lines 172 and the second conductors 134 in the third interlayer insulation film 180.

Figure 5D:
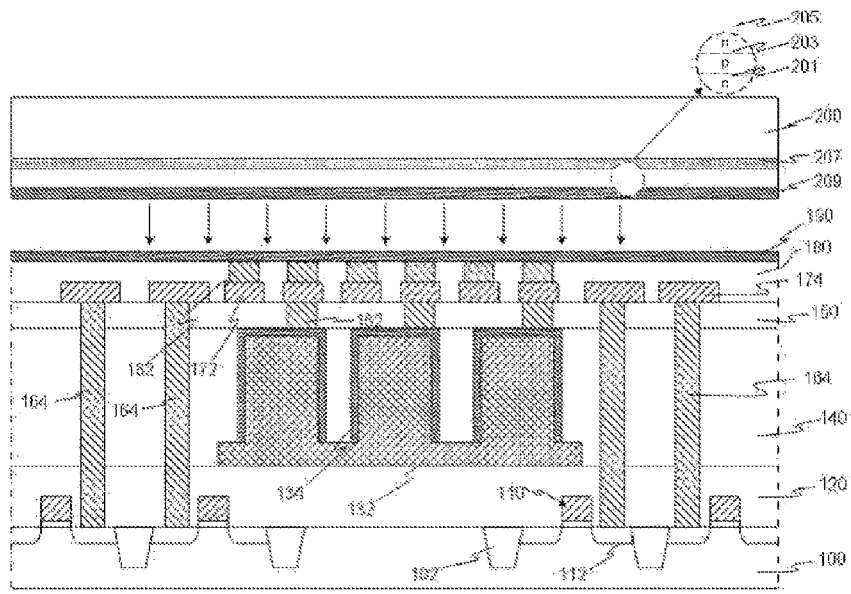

As illustrated in FIG. 5d, on the third interlayer insulation film 180 which is on most top of the first semiconductor substrate 100, a bonding layer 190 is formed to bond a second semiconductor substrate 200 in which switching devices will be formed.

The bonding layer 190 can be formed with, for example, photo-setting adhesive such as reaction-setting adhesive, thermal-setting adhesive, photo-setting adhesive such as UV-setting adhesive, or anaerobe adhesive. Further, the bonding layer can be, such as, metallic bonds(Ti, TiN, Al), epoxy, acrylate, or silicon adhesives.

In case of the bonding layer 190 is metallic bond, the metal can have lower melting temperature than the conductor materials used for the lower region contact plugs 162, 164 and conductor lines 172, 174. Also, the bonding layer 190 can be formed with materials with reflow characteristics at low temperature so that creation of void can be reduced during a bonding process between the bonding layer 190 and the second semiconductor substrate 200. Specifically, the bonding layer 190 can increase bonding strength as well as reduce micro defects such as micro voids.

Then, the second semiconductor substrate 200 is bonded on the bonding layer 190. The second semiconductor substrate can be a single crystalline semiconductor substrate which has multiple doping layers 201, 203, 205 in pre-defined depths from the surface. The multiple doping layers 210, 203, 205 can be formed by ion-implanting dopants into the surface of the single crystalline semiconductor substrate or by adding dopants during an epitaxial growth process to form the single crystalline semiconductor substrate.

The multiple doped layer 200 can be formed by ion-implanting dopants to arrange n-type doped layer 201, 205 and p-type doped layer 203 located alternatively. In an embodiment of this invention, n-type doped layer 201 is formed on the surface of the multiple doped layers 201, 203, 205 so that the n-type doped layer is bonded to the bonding layer 190 and eventually forms NMOS transistors.

A detaching layer 207 is included in between the interface of the multiple doped layers 201, 203, 205 and the single crystalline semiconductor substrate. The detaching layer can be formed as porous layer, insulation film layer such as oxide or nitride, organic bonding layer, or strained layer which is formed by crystalline lattice difference such as Si—Ge. Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and long time should be performed, and this can strongly damage the cell devices underneath.

The detaching layer 207 can protect the multiple doped layers 201, 203, 205 when the second semiconductor substrate 200 is bonded onto the bonding layer 190 and then the single crystalline semiconductor substrate is removed. Also, the detaching layer 207 helps to clearly separate the single crystalline semiconductor substrate while precisely and easily remaining only the multiple doped layers 201, 203, 205.

Figure 5E:
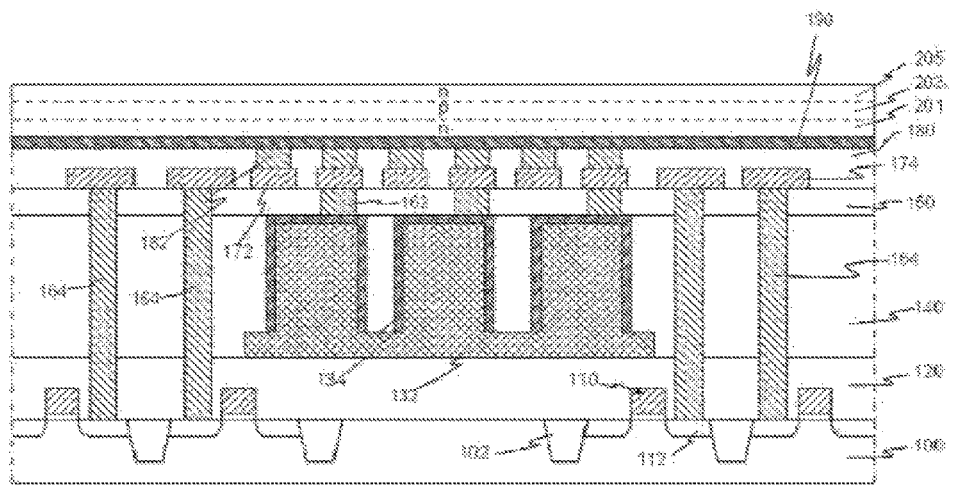

As shown in FIG. 5e, the second semiconductor substrate 200 is bonded to the bonding layer 190 to be face to face to the multiple doped layers 201, 203, 205. In order to increase bonding strength, a heat treatment under a pressure can be performed after bonding the second semiconductor substrate to surface of the bonding layer 190.

It should be emphasized that no precise alignment is required when bonding the second semiconductor substrate 200 on the bonding layer 190 because there are no semiconductor devices formed on the second semiconductor substrate 200 when bonding the second semiconductor substrate 200 including the multiple doped layer 201, 203, 205 on the bonding layer 190.

After bonding is done, all of the second semiconductor substrate only except the doped layers 200 is removed. As a result of this process, only multiple doped layers 201, 203, 205 can be remained on the bonding layer 190.

Specifically, grinding or polishing process can be performed at the single crystalline semiconductor region until the detaching layer 207 is exposed from the bonded second semiconductor substrate 200. After the detaching layer 207 is exposed, anisotropic or isotropic etch process can be performed to expose surface of the multiple doped layers 201, 203, 205. That is, the n-type doped layer 205 is exposed.

It is possible to expose only the multiple doped layers 201 because dopant grades are different at the detaching layer 207 and the multiple doped layers 201, 203, 205 so that etch selectivity is different between the detaching layer 207 and the multiple doped layers 201, 203, 205. In other method, a physical shock can be applied to the detaching layer 207 so that a crack is created at and along the detaching layer and eventually the crack separates the single crystalline semiconductor substrate and the multiple doped layers 201, 203, 205.

As described, n-type doped layer 201, p-type doped layer 203, and n-type doped layer 205 can be created in order on the bonding layer 190 by bonding the second semiconductor substrate 200 which includes multiple doped layers 201, 203, 205 on the bonding layer 190 and then removing the single crystalline semiconductor substrate only except the multiple doped layers 201, 203, 205.

Figure 5F:
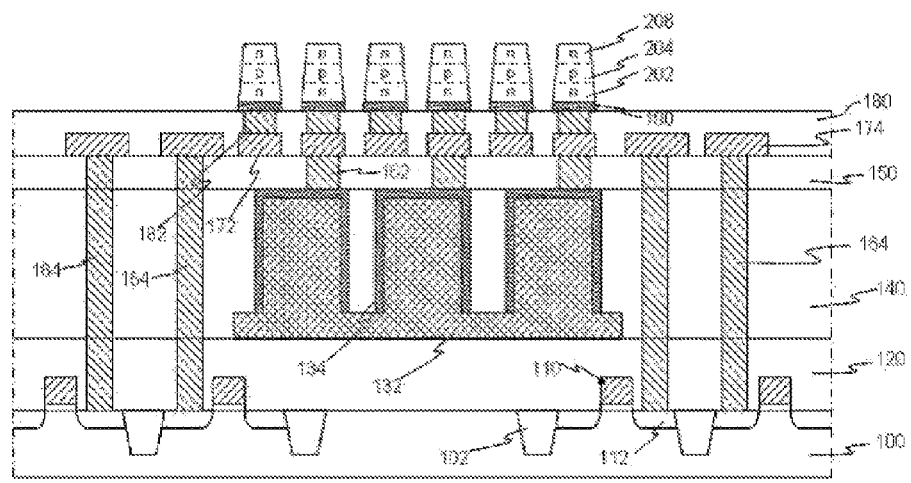

As illustrated in FIG. 5f, pillar shape semiconductor patterns 202, 204, 206 are formed to create switching devices, those are transistors, with vertical channel structure. Pillar shape semiconductor patterns 202, 204, 206 are formed by patterning the multiple doped layers 201, 203, 205 so that they can become channeled region 204 and source/drain region 202, 206 of the switching device.

Specifically, the semiconductor patterns 202, 204, 206 can be formed by performing photolithography/etch process to the multiple doped layers. More specifically, n/p/n type doped layers pattern can be formed. The bonding layer 190 also can be etched when forming the semiconductor patterns 202, 204, 206. In this case, bonding layer pattern 190 can be formed underneath of each of the pillar shape semiconductor patterns 202, and part of surface of the third interlayer insulation film 180 can be exposed.

Figure 5G:
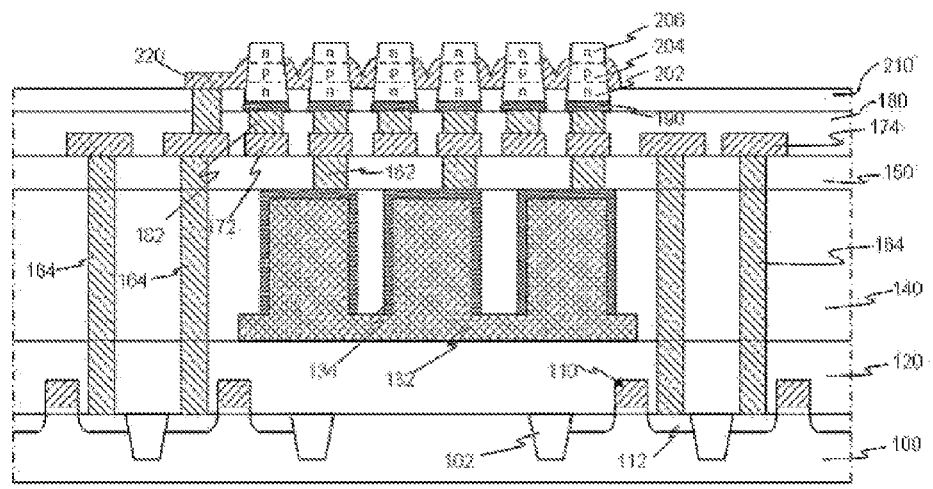

As illustrated in FIG. 5g, a gate conductor 220 is formed as spacer shape around the center area (204) of the semiconductor patterns 202, 204, 206.

Specifically, a fourth interlayer insulation film 210 is formed on the third interlayer insulation film 180 which covers the sidewall of the semiconductor pattern 202 which is bonded to the bonding layer 190. Gate contact plugs are formed in the third and fourth interlayer insulation film 180, 210 in order to connect logic devices in the lower region and gate conductor 220. As following steps, gate dielectric film and gate conductor film are deposited on the fourth interlayer insulation film 210, conformal to the surface of the semiconductor patterns. The gate dielectric film and the gate conductor film can be anisotropic etched to form a spacer shape gate conductor 220 which surrounds the p-type semiconductor pattern 204 which is located in center and roles as channel region. As a result, transistors which have vertical channel can be formed.

Figure 5H:
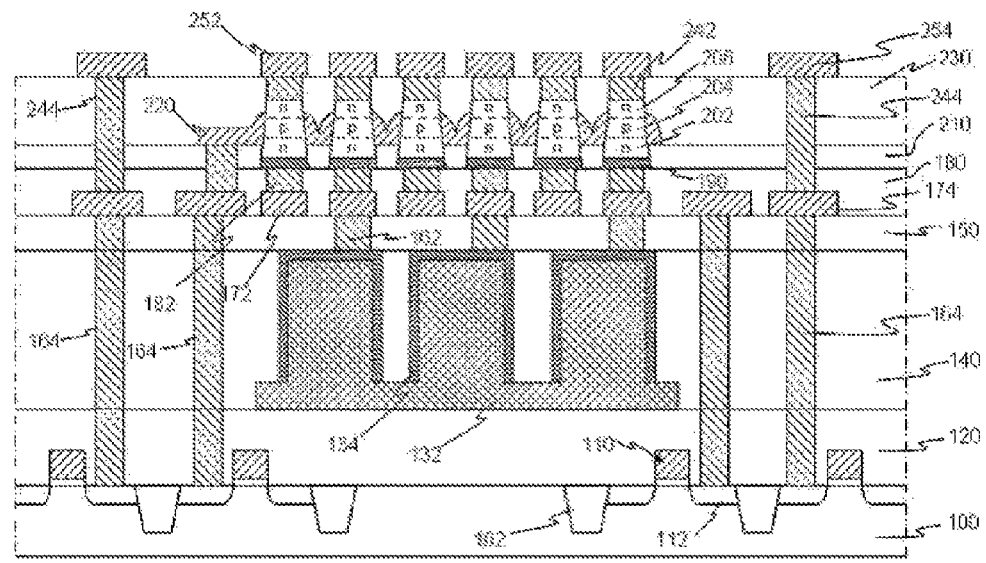

As illustrated in FIG. 5h, a fifth interlayer insulation film 230 is formed to cover the pillar shape semiconductor patterns 202, 204, 206 and the gate conductors 220. Then, source/drain contacts plugs 242 are formed to respectively contact to source/drain regions 206 in the fifth interlayer insulation film 230, and at the same time second contact plugs for logic 244 can be formed which contact to logic devices. Conducting lines 252, 254 are formed on the each contact plugs 242, 244. The conducting lines 252, which are located on the semiconductor patterns 202, 204, 206 which are connected to the capacitors 132, 134, can be bit lines.

Figure 5I:
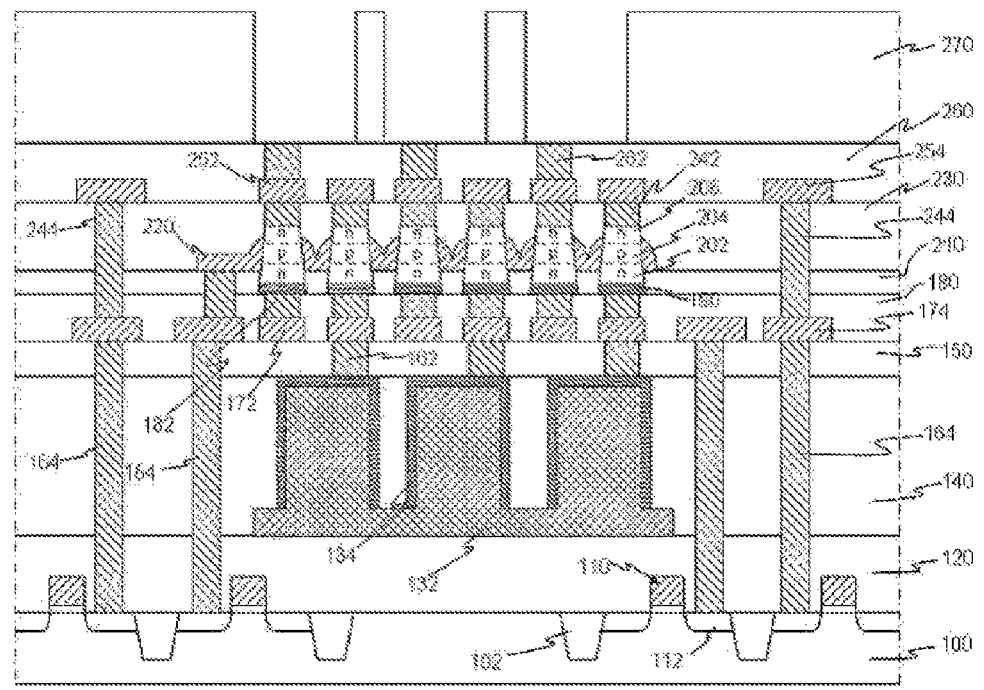

As shown in FIG. 5i, after forming the conducting liner 252, 254, a sixth interlayer insulation film 260 is formed, and then contact plugs 262 for upper region storage node which are connected to the conducting lines 252 can be selectively formed.

Contact plugs 262 for upper region storage node which will connect the second conductor and the source/drain region 206 is formed on the semiconductor patterns 202, 204, 206 to which capacitors 132, 134 are not connected below among the semiconductor patterns 202, 204, 206.

In the following steps, upper region capacitors are formed as upper region data storage devices. The upper region data storage devices are formed to be symmetric to the lower region data storage devices, and can be connected to the switching devices which are not connected to the lower region data storage devices. Also, the switching devices connected to the lower region data storage devices can be arranged alternative in order to the switching devices connected to the upper region data storage devices. In an embodiment of this invention, the upper data storage devices can be formed in cylinder shape.

Specifically, a seventh interlayer insulation film 270 is formed to have enough thickness on the sixth interlayer insulation film 260. The seventh interlayer insulation film 270 is then patterned to have openings which expose top side of the contact plugs 262 for the upper region storage nodes.

Figure 5J:
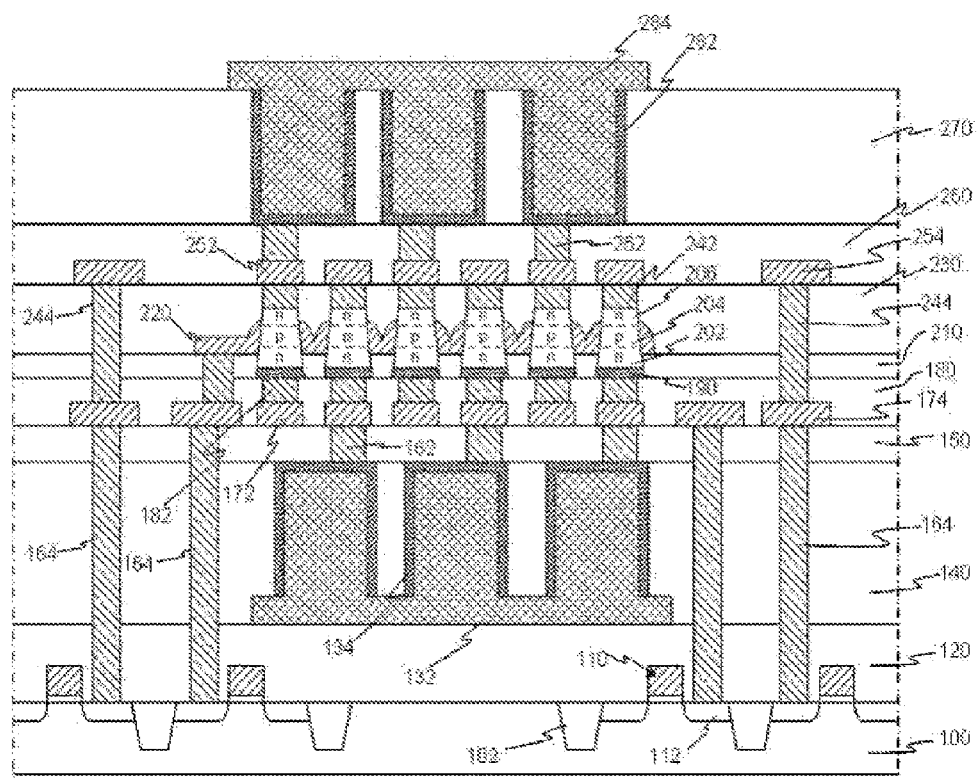

In FIG. 5j, a conducting film for second conductor of upper capacitor is deposited conformal to the surface of the seventh interlayer insulation film 270 in where the openings are formed. Then a insulation film with good gap filling characteristics (not illustrated) is deposited and then the conducting film for the second conductor is planarized until the seventh interlayer insulation film 270 is exposed, to form the cylinder shape second conductors 282. A dielectric film (not illustrated) is deposited conformal to the surface of the second conductors 282 and then conducting film for the first conductor is deposited to fill up inside of the second conductors 282. The conducting film for the first conductor is then patterned to form the first conductors 284.

Figure 5K:
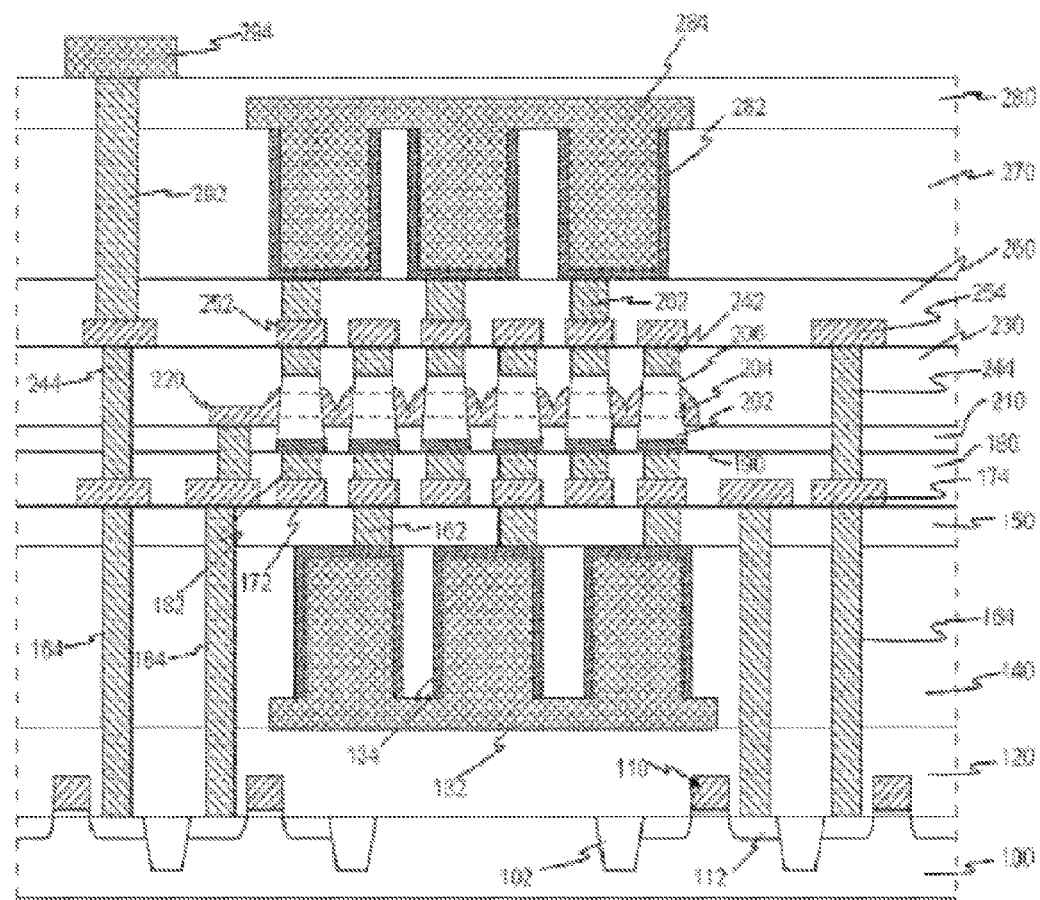

As shown in FIG. 5k, an eighth interlayer insulation film 280 can be formed on the seventh interlayer insulation film 270 to cover the upper region data storage devices 282, 284. Finally, third contact plugs for logic 292 and wirings 294 can be formed which are connected to the logic devices.

Specifically, in first embodiment of this invention, switching devices can be formed on the logic devices by bonding a semiconductor substrate and those switching devices can have vertical channel.

A method for fabricating a semiconductor device in accordance with a second embodiment of this invention if illustrated in FIGS. 6a to 6h.

Figure 6A:
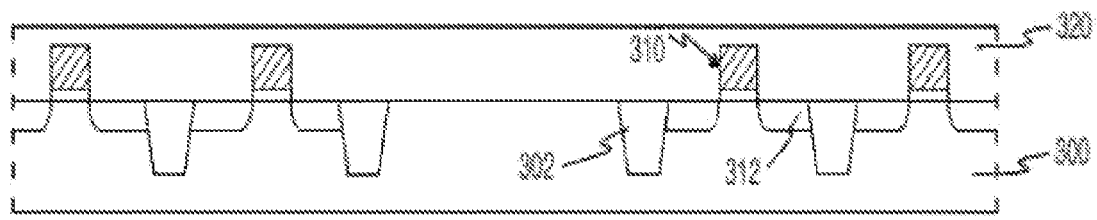
FIGS. 6a to 6h are sectional views of steps in forming a semiconductor memory device.

In FIG. 6a, logic devices are formed on the first semiconductor substrate 300. Specifically, NMOS and PMOS transistors 310, 312, resistors (not illustrated), diodes (not illustrated) and wirings (not illustrated) are formed on the first semiconductor substrate 300 to form the logic devices.

More specifically, isolation films 302 are formed in the first semiconductor substrate 300 to define active region. Gate dielectric film and gate conductor film can be deposited and patterned to form gate electrodes 310, on the first semiconductor substrate 300 in which the active regions are formed. After forming the gate conductor 301*m* dopants are ion-implanted to the each side of the gate conductor 310 to form source/drain regions 312. As a result, transistors are formed on the first semiconductor substrate 300.

A first interlayer insulation film 320 is formed by depositing insulation film with good step coverage on the transistors 310, 312. Resistors (not illustrated), diodes (not illustrated) and wirings (not illustrated) can be included in the first interlayer insulation film 320.

Figure 6B:
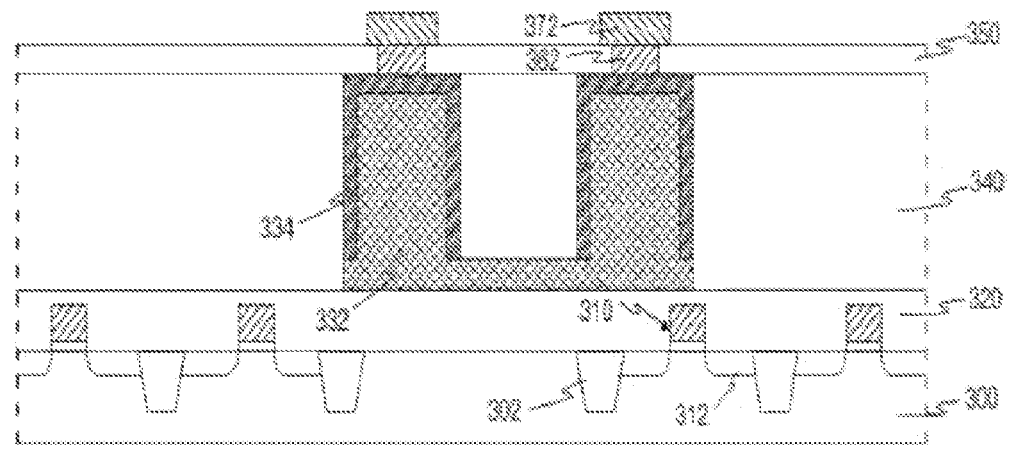

In FIG. 6b, lower region data storage devices are formed on the first interlayer insulation film 320 in which the logic devices are buried. In one embodiment of this invention, capacitors can be used for lower region data storage devices.

First electrodes 332 are formed as plate electrodes, on the first interlayer insulation film 320 in which logic devices are buried. Specifically, a conducting film for the first electrodes is deposited with enough thickness on the first interlayer insulation film 320, and the conducting film for the first electrodes are photolithography/etched to form pillar shape first electrodes 332. The first electrodes can be electrically connected each other to where ground potential is applied.

Then, a dielectric film (not illustrated) and a conducting film for second electrodes are deposited conformal. The conducting film for the second electrodes is etched to isolate and separate the conducting film for the second electrodes into the second electrodes 334. The second electrodes 334 are covering the pillar shape first electrodes 332 conformal and the second electrodes 334 are separated each other. The second electrodes 334 are storage node electrodes and can be formed in cylinder shape which has a open bottom.

After forming the capacitors 332, 334, second interlayer insulation film 340, 350 is deposited. The second interlayer insulation films can be oxide. The top surface of the second interlayer insulation film 340, 350 can be planarized by CMP or etchback processes. As following steps, contact plugs 362 and conducting pads 372 can be formed to be connected to the second electrodes 334.

The lower region data storage devices on the first interlayer insulation film 320 can be formed by refractory metal materials which has characteristics such as low resistance, low stress, good step coverage and good thermal expansion coefficient in order to reduce affection from the following high temperature processes. Specifically, the first and second electrodes 332, 334 of the capacitors, contact plugs 362, and conducting pads 372 can be formed with refractory metal. The refractory metal can be of many different types, such as tungsten (W), titanium (Ti), molybdenum (Mo), tantalum (Ta), titanium nitride (TiN), tantalum nitride (TaN), zirconium nitride (ZrN), tungsten nitride, and alloys thereof. Also, the first and second electrodes 332, 334 can be formed with poly-silicon film. By this, the electric characteristics and reliabilities of the lower region data storage devices can be maintained even after the following high temperature process steps (i.e. switching device formation process steps).

Figure 6C:
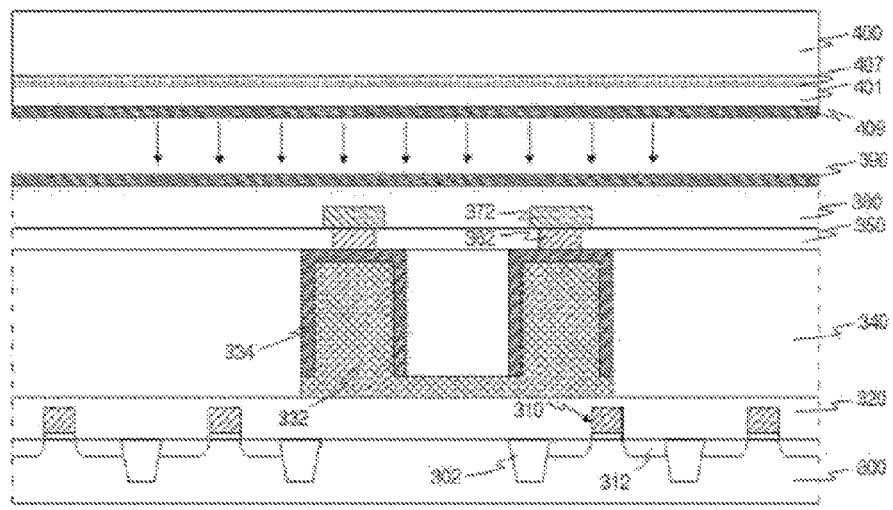

In FIG. 6c, a third interlayer insulation film 380 are formed and planarized to cover the conducting pads 372 on the lower region capacitors 332, 334. Then, a bonding layer 390 is formed on the third interlayer insulation film 380. The bonding layer 390 is for bonding a second semiconductor substrate 400, and formed on the most upper layer of the first semiconductor substrate 300.

The bonding layer 390 can be photo-setting adhesive such as reaction-setting adhesive, thermal-setting adhesive, photo-setting adhesive such as UV-setting adhesive, or anaerobe adhesive. In case of the bonding layer 390 is metallic bond, the metal can have lower melting temperature than the conductor materials used for the lower region contact plugs 362 and conductor lines 372. Also, the bonding layer 390 can be formed with materials with reflow characteristics at low temperature so that creation of void can be reduced during a bonding process between the bonding layer 390 and the second semiconductor substrate 400. Specifically, the bonding layer 390 can increase bonding strength as well as reduce micro defects such as micro voids.

In the following step, the second semiconductor substrate 400 is bonded onto the bonding layer 390.

Specifically, the second semiconductor substrate 400 is a single crystalline semiconductor substrate and is prepared to have doped layers 401 which has doped layers in a pre-defined depths. The doped layers 401 can be formed by ion-implanting dopants into the single crystalline semiconductor substrate or by adding dopants during epitaxial process to grow single crystalline semiconductor substrate. And a detaching layer 407 can be formed in a pre-defined depth in the single crystalline semiconductor substrate and the detaching layer 407 is interfacing with the doped layer 401. The detaching layer 407 can be a porous layer including many micro voids, an insulation film such as oxide or nitride, an organic bonding layer, or a strained layer by crystal lattice structure difference (for example Si—Ge). Also, the bonding layer can be also formed on the surface of the doped layer 401.

The second semiconductor substrate 400 is then bonded onto the bonding layer 390, to face the doped layer 401 of the second semiconductor substrate to face the bonding layer of the first semiconductor substrate 300. After bonding the second semiconductor substrate 400 onto the bonding layer 390, a thermal treatment can be performed under certain pressure in order to increase bonding strength.

Figure 6D:
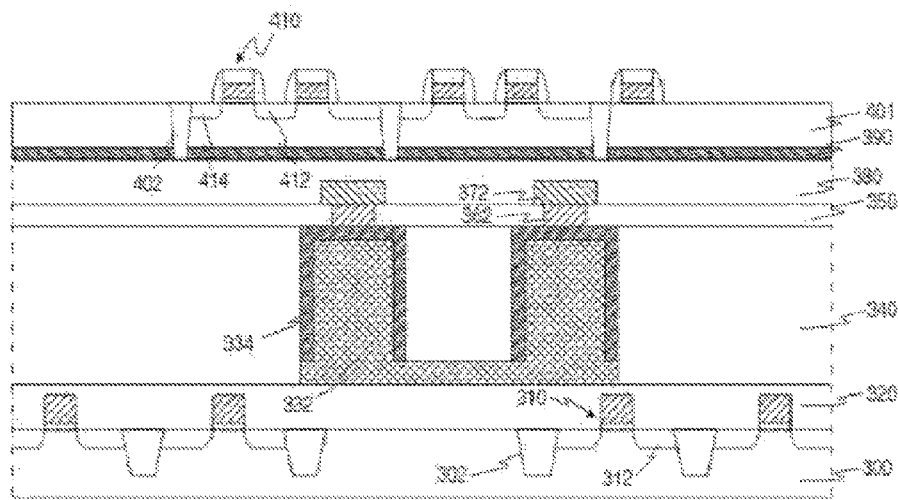

As shown in FIG. 6d, after bonding the second semiconductor substrate 400 on the bonding layer 390, all of the second semiconductor substrate 400 only except the single crystalline semiconductor doped layers 401 is removed. As a result of this process, only the single crystalline semiconductor layers 401 in which n-type or p-type dopants are doped can be remained on the metallic bonding layer 390.

Specifically, grinding or polishing process can be performed at the single crystalline semiconductor region until the detaching layer 407 is exposed from the bonded second semiconductor substrate 400. After the detaching layer 407 is exposed, anisotropic or isotropic etch process can be performed to expose surface of the doped layers.

It is possible to expose only the doped layers 401 because dopants density grades are different at the detaching layer 407 and the doped layers 401 so that etch selectivity is different between the detaching layer 407 and the doped layers 401. In other method, a physical shock can be applied to the detaching layer 407 so that a crack is created at and along the detaching layer and eventually the crack separates the single crystalline semiconductor substrate and the doped layers 401 and remains only doped layers 401 on the bonding layer 390.

In following steps, transistors, which are switching devices having horizontal channels on the bonded single crystalline semiconductor doped layers 401, can be formed.

Specifically, isolation films 402 are formed to define active regions in the bonded single crystalline semiconductor doped layers 401. Gate dielectric film and gate conductor film are deposited and patterned to form gate electrodes 410 on the single crystalline semiconductor doped layers 401. Dopants are doped in the single crystalline semiconductor doped layers 401 at each side of the gate electrodes 410 to form source/drain regions 412, 414. Neighboring gate electrodes 410 can share common source region 412. The drain regions 414 can be formed at apart from the sources regions 412 and close to gate electrode 410 sidewalls in the single crystalline semiconductor doped layers 401. Particular drain regions 414 can be formed on the lower regions capacitors 332, 334, when forming the transistors.

The source/drain regions 412, 414 at each side of the gate electrodes 410 can be formed by dopant ion-implantation and annealing processes. The ion-implantation and annealing process can be performed at high temperatures of 800-850 degree Celsius. Even though in the high temperature environment, the lower region data storage devices formed under the switching devices are formed with refractory metals so that reliability decrement by the high temperature process can be prevented.

Figure 6E:
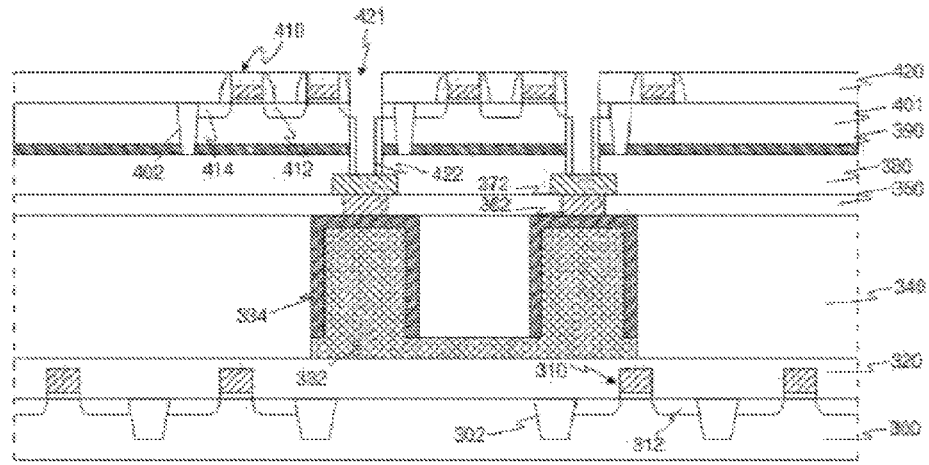

As shown in FIG. 6e, a fourth interlayer insulation film 420 is formed to cover the transistors 410 on the second semiconductor substrate 400. Contact holes 421 are formed by penetrating the fourth interlayer insulation film 420 and the doped layer 401 to expose the conducting lines 472 on the lower regions capacitors 432, 434.

After forming the contact holes 421, an insulation film is deposited along to the surface of the contact holes 421 and etched anisotropic to form spacer shape insulation spacers 422. The insulation spacers 422 can prevent exposing of the bonding layer 390, which is a conducting film, by the contact holes 421.

Figure 6F:
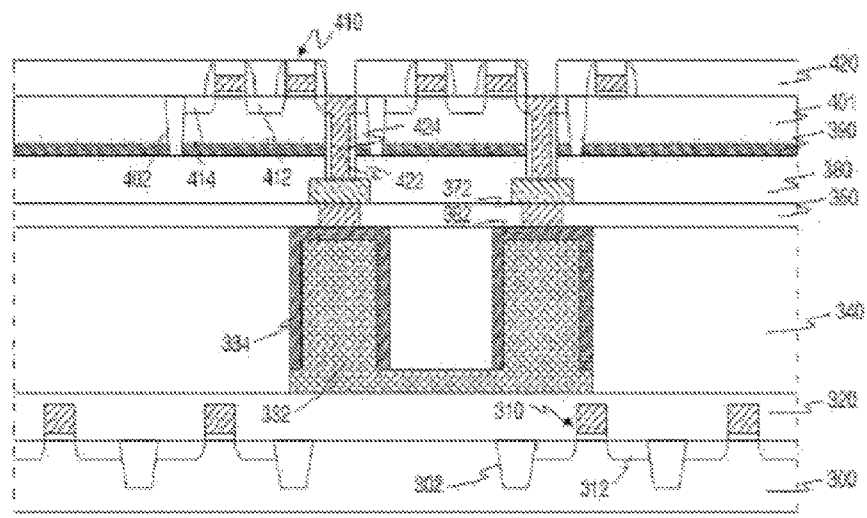

In FIG. 6f, contact plugs 424 for the lower region storage nodes are formed by partially burying conducting material into the contact holes 421 which are penetrating the doped layers 401. The contact plugs 424 for the lower region storage nodes can be buried up to the surface of the doped layers 401, and electrically connected to the drain region 414 formed in the second semiconductor substrate 400.

Figure 6G:
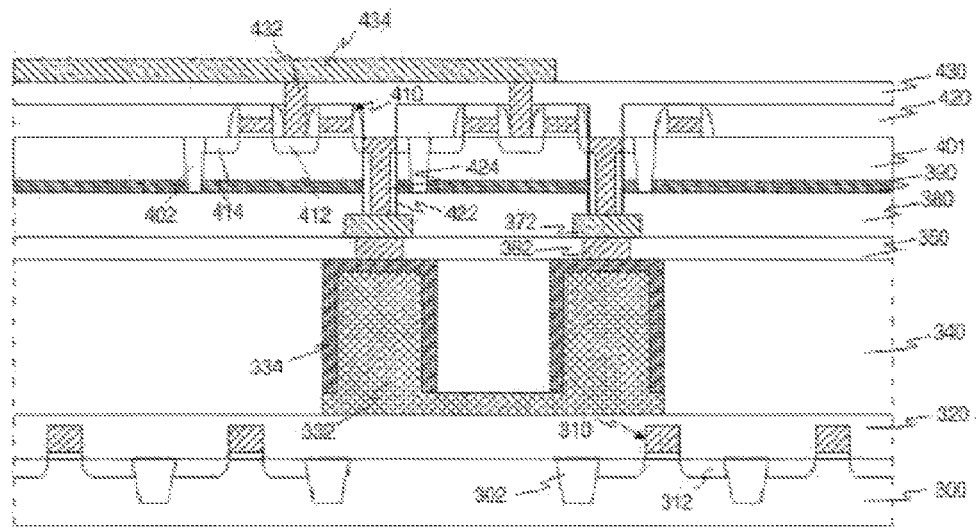

As shown in FIG. 6g, a fifth interlayer insulation film 430 is formed to cover contact holes on the fourth interlayer insulation film 420. Contact plugs 432 for but lines are formed which contact to the common source region 412 in the fourth and fifth interlayer insulation film 420, 430. Contact plugs for electrically connected to the logic devices can be formed when the contact plugs for bit lines 432 are formed. As a following step, bit lines 434 are formed on the contact plugs 432 for the bit lines so that the bit lines are running cross to the gate electrodes 410. Conducting lines (not illustrated) which are connected to the logic devices can be formed when the bit lines 434 are formed.

Figure 6H:
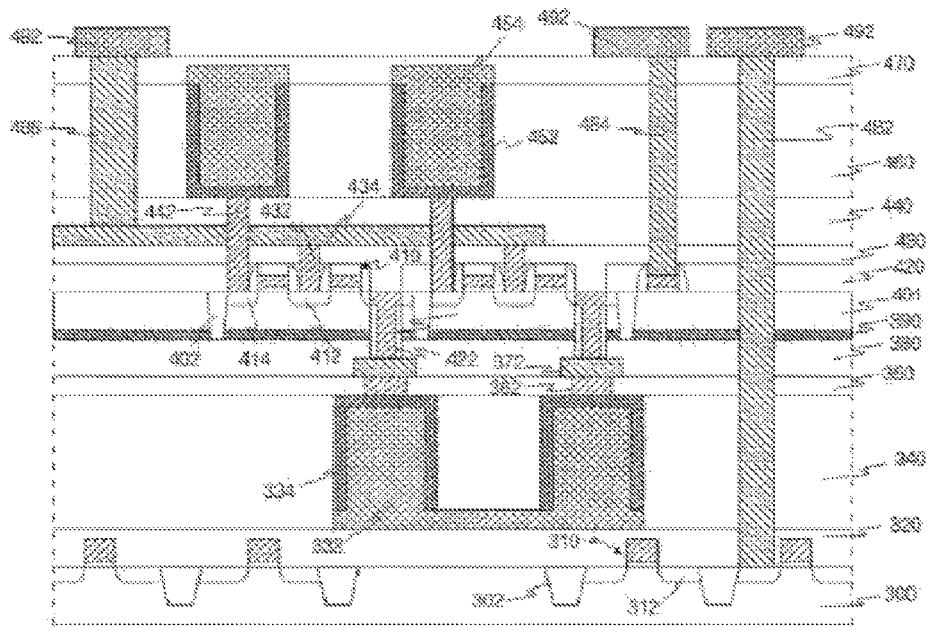

As illustrated in FIG. 6h, a sixth interlayer insulation film 440 is formed to cover the bite lines 434, and contact plugs 442 for the upper region storage nodes are formed in the sixth interlayer insulation film 440 which are connected to the drain region 414.

It should be noted that, even though it seems like the contact plugs 442 for the upper region storage node and the bit lines 434 are overlapped, the bit lines 434 and the contact plugs 442 for the storage node are electrically insulated.

As described in first embodiment of this invention, second electrodes 452 can be formed as open top cylinder shape on the contact plugs 442 for the upper region storage node. Then, a dielectric film (not illustrated) and first electrodes 454 can be formed on the second electrodes 452. The first electrodes 454 can fill in the cylinder shape second electrodes 452.

In the following steps, a eighth interlayer insulation film 470 is formed to cover the upper regions capacitors 452, 454, and contact plugs 482 and final metal wirings 492 for connecting to the logic devices 310, 312 are formed.

FIGS. 7a to 7h are sectional views of steps in forming a semiconductor memory device in accordance with a third embodiment of this invention.

Figure 7A:
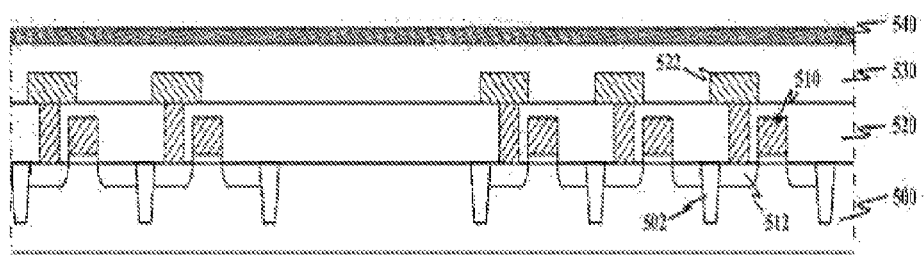
FIGS. 7a to 7h are sectional views of steps in forming a semiconductor memory device.

As illustrated in FIG. 7a, a first semiconductor substrate is provided. Logic devices are already formed on the first semiconductor substrate.

Specifically, transistors 510, 512 are formed on the first semiconductor substrate 500, and a first interlayer insulation film 520 is formed to cover the transistors 510, 512. Contact plugs are formed in the first interlayer insulation film 520, and wiring 522 can be formed on the contact plugs. A second interlayer insulation film 530 is formed to cover the wirings 522 and then surface is planarized.

After the logic devices are formed, a bonding layer 540 is formed on the second interlayer insulation film 530.

Figure 7B:
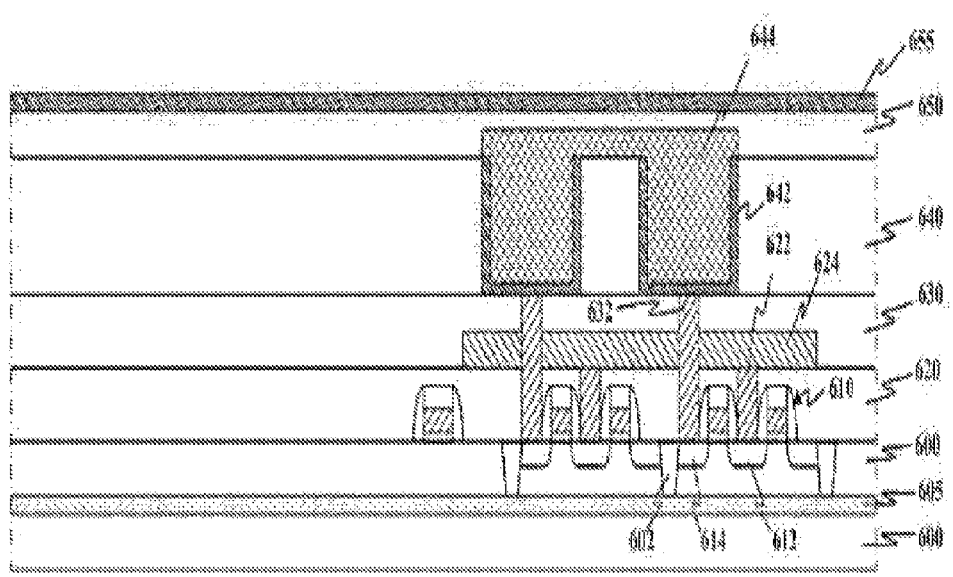

As shown in FIG. 7b, a second semiconductor substrate 600 is provided. The second semiconductor substrate 600 includes switching devices 610, 612, 614 and first data storage devices 642, 644. Specifically, the second semiconductor substrate 600 can be a single crystalline semiconductor substrate including doped layer 600b which has dopants doped to a pre-defined depth from surface of the second semiconductor substrate 600. The single crystalline semiconductor substrate includes doped layer 600b to a pre-defined depth from the top surface. Also, a detaching layer 605 can be included in the single crystalline semiconductor substrate and the detaching layer 605 is interfacing with the doped layer 600b.

Transistors with horizontal channel 610, 612, 614 are formed on the second semiconductor substrate 600. After forming the transistors, a first interlayer insulation film 620 is deposited to cover the transistors 610, 612, 614, and contact plugs 622 for bit line and bit lines 624 are formed step by step. The contact plugs 622 are connected to the common source region of the transistors. A second interlayer insulation film 630 is formed to cover the bit lines, and contact plugs for storage nodes 632 are formed in the first and second interlayer insulation film 620, 630. In following steps, capacitors 642, 644 are formed on the each of the contact plugs for the storage node 632. A dielectric film (not illustrated) and plate electrode 644 are formed to cover the storage node electrodes 642. A fourth interlayer insulation film 650 is formed to cover the capacitors 642, 644, and a bonding layer 655 is formed on the fourth interlayer insulation film 650.

Figure 7C:
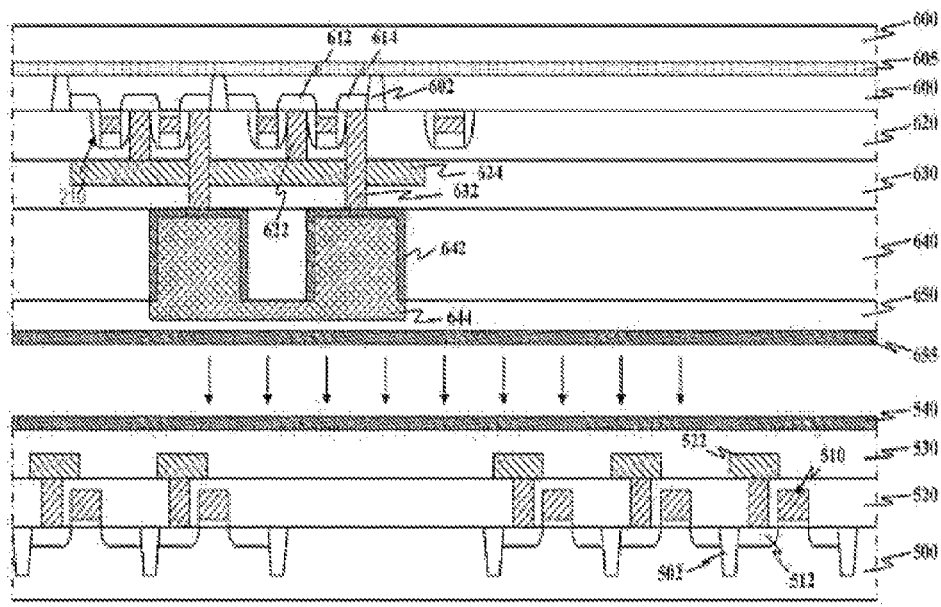

As shown in FIG. 7c, the first semiconductor substrate which includes the logic devices 510, 512, 522 and the second semiconductor substrate 600 which includes switching devices 610, 612, 614 and the data storage devices 642, 644 are bonded together.

Specifically, the bonding layer 540 on the first semiconductor substrate 500 and the bonding layer 655 on the second semiconductor substrate 600 are facing each other to be bonded to form the second semiconductor substrate 600 on the first semiconductor substrate 500. As a result, the first data storage devices 642, 644 and the switching devices 610, 612, 614 are formed following the order.

Figure 7D:
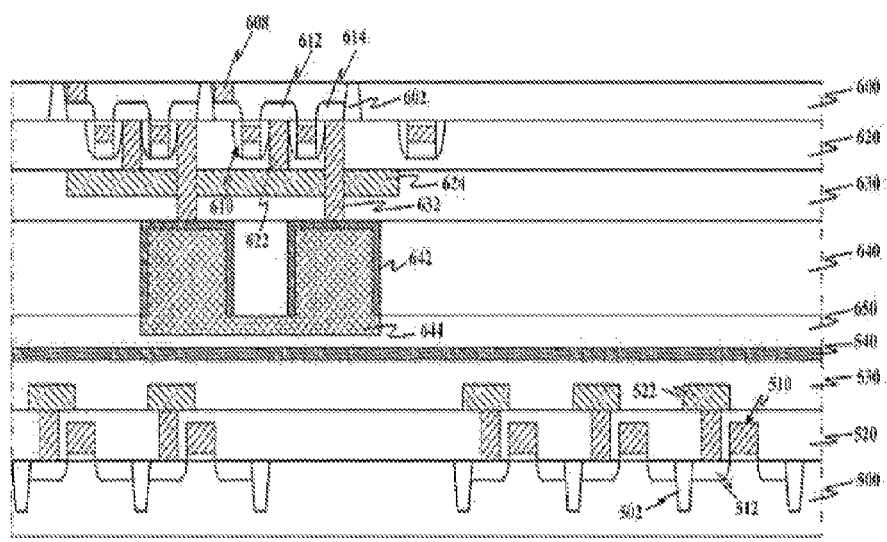

In FIG. 7d, part of backside 600a of the second semiconductor substrate 600 is removed. The detaching layer 605 in the second semiconductor substrate 600 can control the removing of part of the second semiconductor substrate 600.

In following steps, contact plugs 608 are formed to be connected to the selected drain region 614 of the transistors in the second semiconductor substrate 600.

Figure 7E:
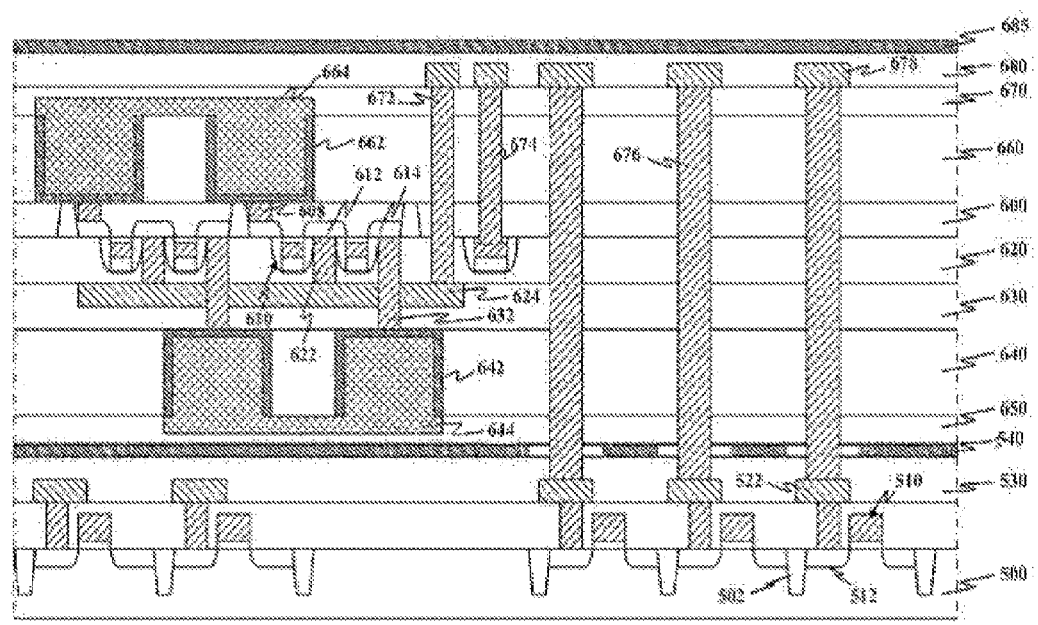

As illustrated in FIG. 7e, second data storage devices 662, 664 are formed on the backside surface of the second semiconductor substrate 600. Specifically, capacitors 662, 664 are formed to be connected to the contact plugs 608 at the backside surface of the second semiconductor substrate 600. More specifically, on the backside surface of the second semiconductor substrate 600, open top cylinder shape storage node electrodes 662 are formed, and then a dielectric film (not illustrated) and plate electrode 664 are formed.

After forming the capacitors 662, 664, contact plugs 672, 684, 676 and conducting lines 685 are formed corresponding to each of the bit lines 624, gate electrodes 610 and logic devices 510, 512.

In following steps, an insulation film 680 is formed to cover the conducting lines 678, and a bonding layer 685 is formed on the interlayer insulation film 680.

Figure 7F:
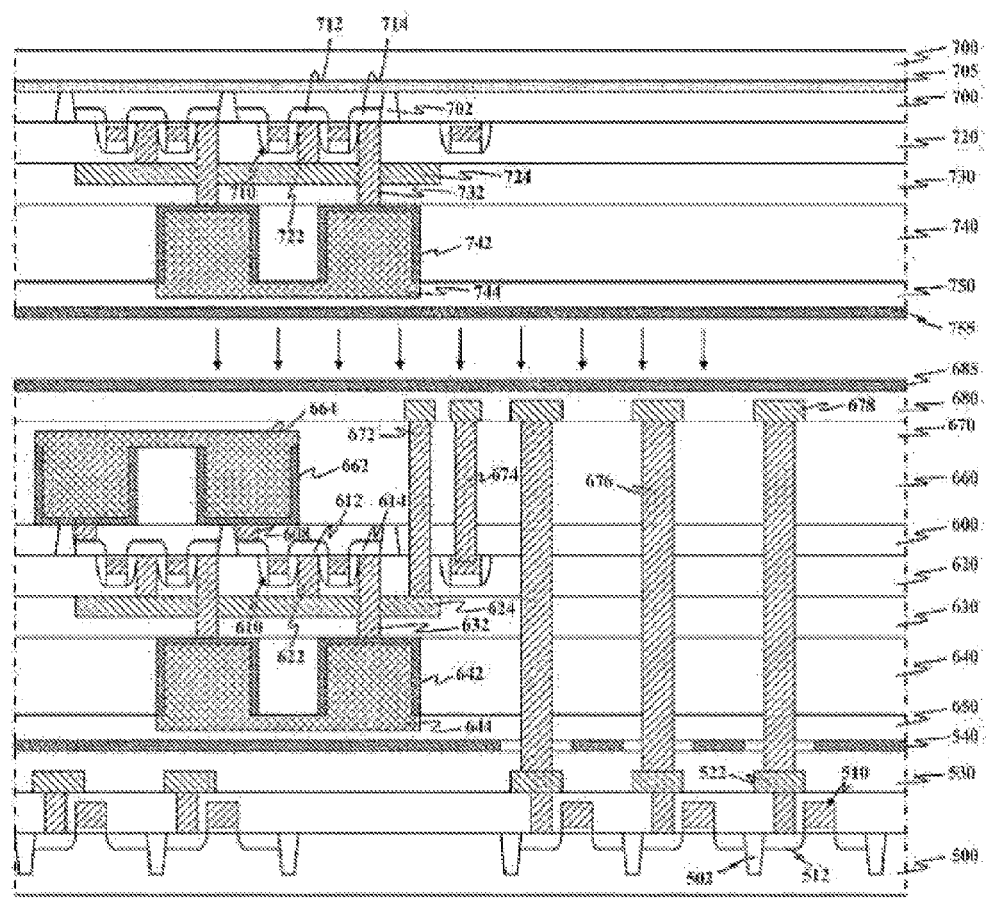

As shown in FIG. 7f, a third semiconductor substrate 700 which includes switching devices 710, 712, 714 and third data storage devices 742, 744 is provided, a bonding layer 755 is formed on the top surface of the third semiconductor substrate 700, and the bonding layer 755 is bonded to the bonding layer 685 of the second semiconductor substrate 600. Specifically, formation of the switching devices 710, 712 and the third data storage devices 742, 744 on the third semiconductor substrate 700 can be similar to the formation of the switching devices 510, 512 and the second data storage devices 610, 612, 614 on the second semiconductor substrate 600 as illustrated in FIG. 7b.

Figure 7G:
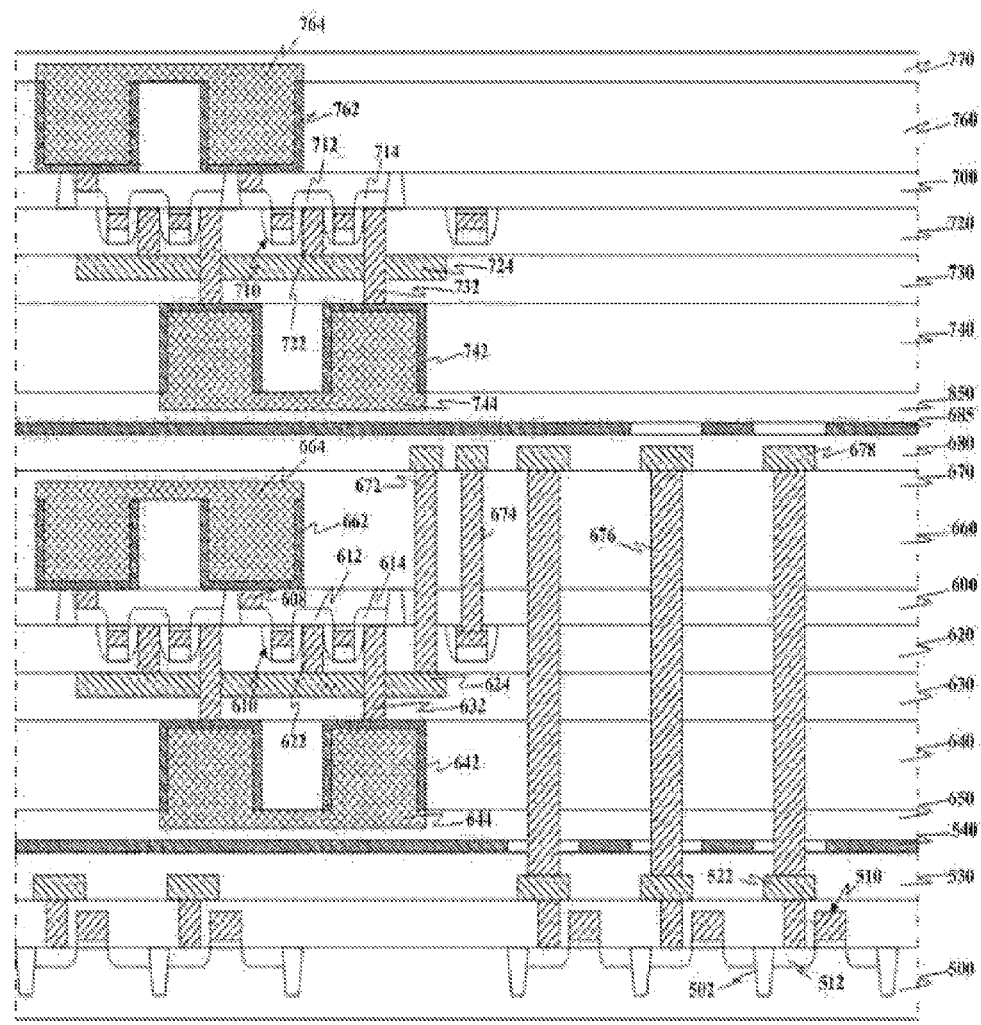

As illustrated in FIG. 7g, part of the backside of the third semiconductor substrate 700 is removed, and then fourth data storage devices 762, 764 are formed to be electrically connected to the switching devices 710, 712.

Specifically, contact plugs for storage node are formed to be connected to the drain region 714 of the transistors in the third semiconductor substrate 700. Capacitors 762, 764 are formed on the contact plugs for storage node. More specifically, the third data storage devices 742, 744 are formed below the switching devices 710, 712, and the fourth data storage devices 762, 764 can be formed above the switching devices 710, 712.

Figure 7H:
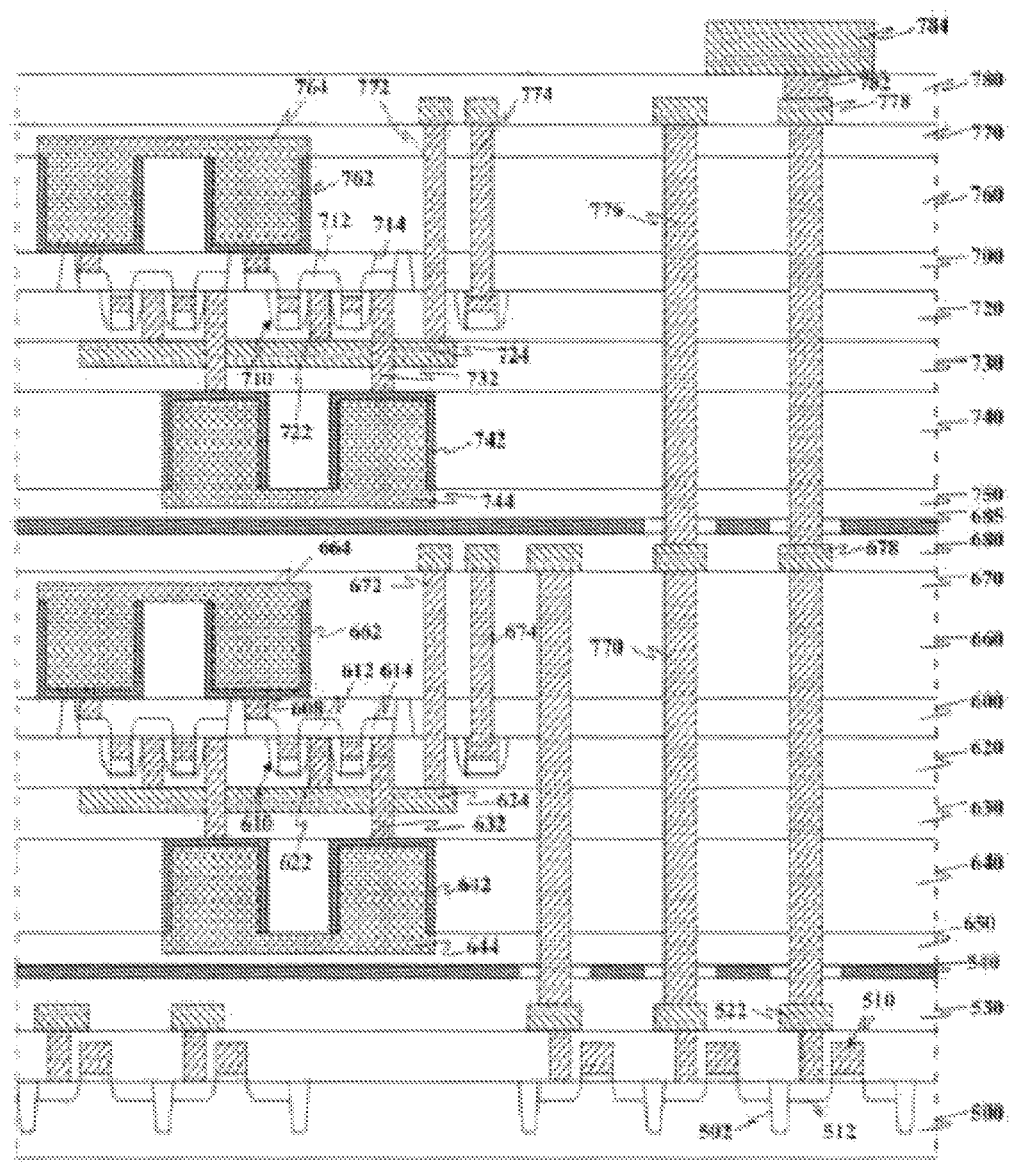

In FIG. 7h, contact plugs 772, 774 and conducting lines 778 are formed to be connected respectively to each of the bit lines 724 and gate electrodes 310 on the third semiconductor substrate 700. At the same time, contact plugs 778 and conducting lines 778 are formed to be connected to the lower region logic devices 510, 512, 522. In following steps, final metal wirings 784 are formed on the contact plugs 778 which is connected to the logic devices 510, 512, 522.

As described, by bonding the semiconductor substrate with logic devices and the semiconductor substrate with switching and data storage devices, the switching devices and the data storage devices can be formed on top of the logic devices. It should be noted that by repeating the bonding of the semiconductor substrates with switching devices and the semiconductor substrate with the data storage devices on the logic devices, the chip density of the semiconductor memory device can be increased.

Figure 8A:
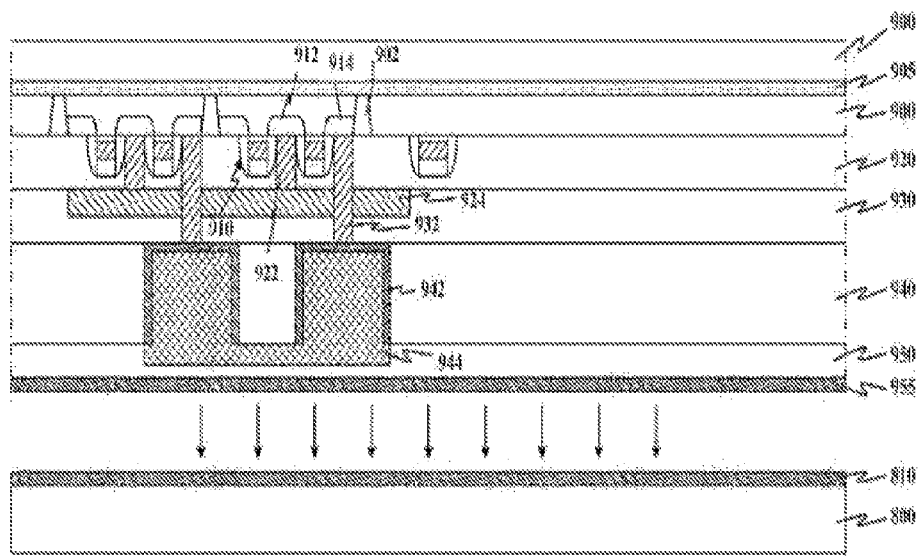
FIGS. 8a to 8j are sectional views of steps in forming a semiconductor memory device.

As illustrated in FIG. 8a, a first semiconductor substrate 800 is provided. The first semiconductor substrate 800 includes a bonding layer 810 on the surface. The first semiconductor substrate 800 can be also a substrate not having any doped layers or other devices.

A second semiconductor substrate 900 is provided. The second semiconductor substrate 900 includes switching devices 910, 912, 914 and first data storage devices 942, 944. The second semiconductor substrate 900 also includes a detaching layer 905 which can act as an etch stopper when removing part of the second semiconductor substrate in following process steps. The forming method of the switching devices 910, 912, 914 and the first data storage devices 942, 944 can be similar to the method as described with FIG. 5b. an interlayer insulation film 950 is formed to cover the first data storage devices 942, 944, and a bonding layer 955 is formed on the interlayer insulation film 950.

The bonding layer 810 of the first semiconductor substrate 800 and the bonding layer 955 of the second semiconductor substrate 900 are bonded together face to face. As a result, the second semiconductor substrate 900 is on top of the first semiconductor substrate 800, and backside of the second semiconductor substrate 900 is exposed.

Figure 8B:
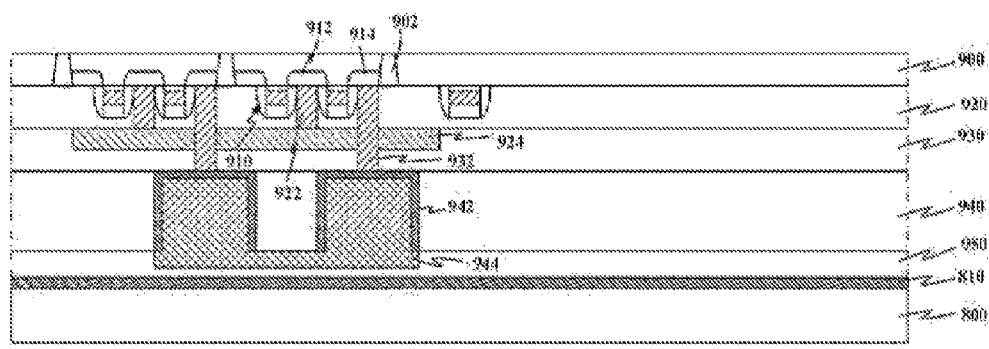

As shown in FIG. 8b, data storage device 942, 944 and switching devices 910, 912 can be arranged in order on the first semiconductor substrate 800. Then, part of the backside of the second semiconductor substrate 900 is removed. The detaching layer 905 formed in the second semiconductor substrate 900 can be also removed when part of the backside of the second semiconductor substrate 900 is removed.

Figure 8C:
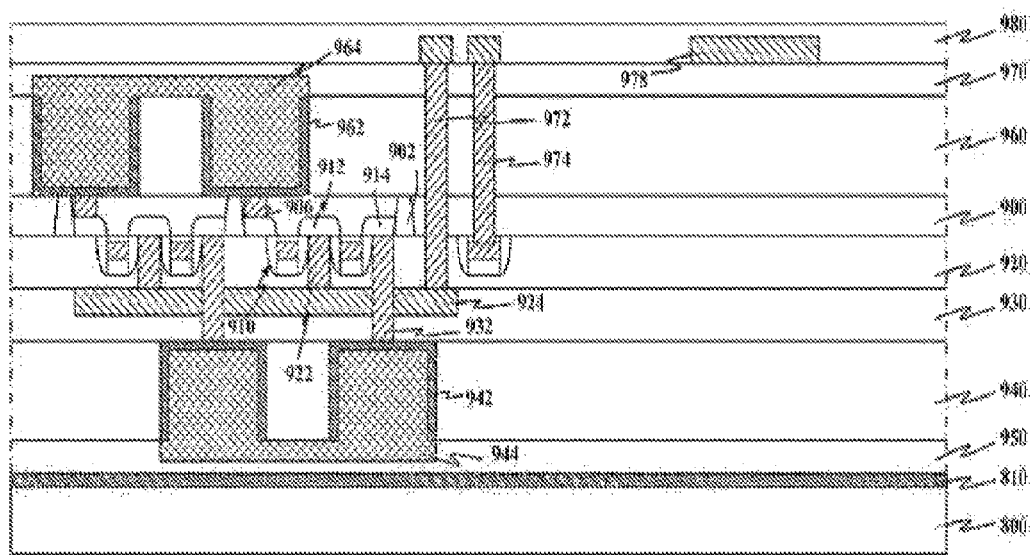

In FIG. 8c, second data storage devices 962, 964 are formed on the backside of the second semiconductor substrate 900. Specifically, contact plugs for storage node 908 are formed to be connected to the drain region 914 in the second semiconductor substrate 900. Capacitors 942, 944 are formed on the contact plugs for the storage node. Contact plugs 908 and wirings 978 are formed to be respectively connected to the bit lines 924 and gate electrodes 910.

Figure 8D:
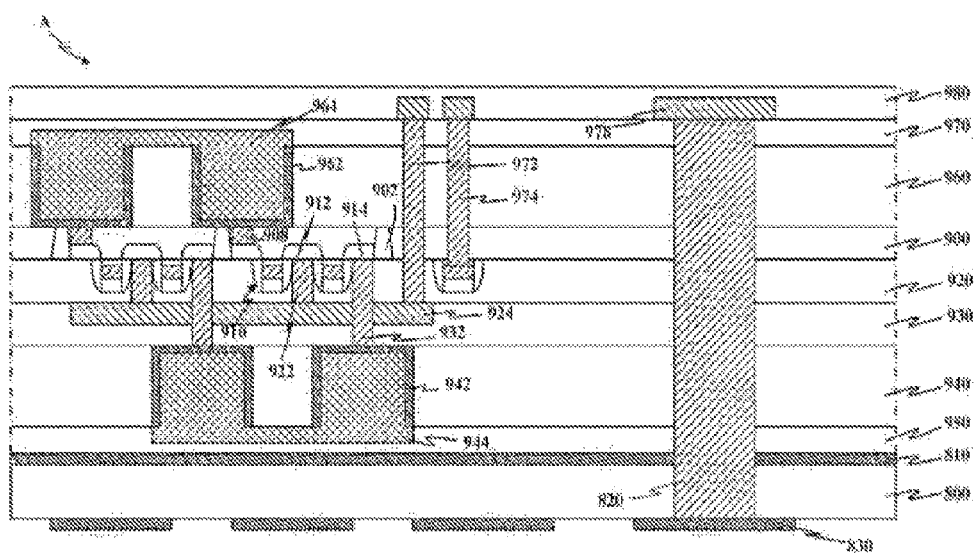

As shown in FIG. 8d, contact plugs 820 are formed to be connected from the third semiconductor substrate 800 to the wirings 978, for connection to the logic devices which will be bonded at following process steps. A bonding layer 830 is formed at the backside of the third semiconductor substrate 800. This completes preparation of the first semiconductor device A.

Figure 8E:
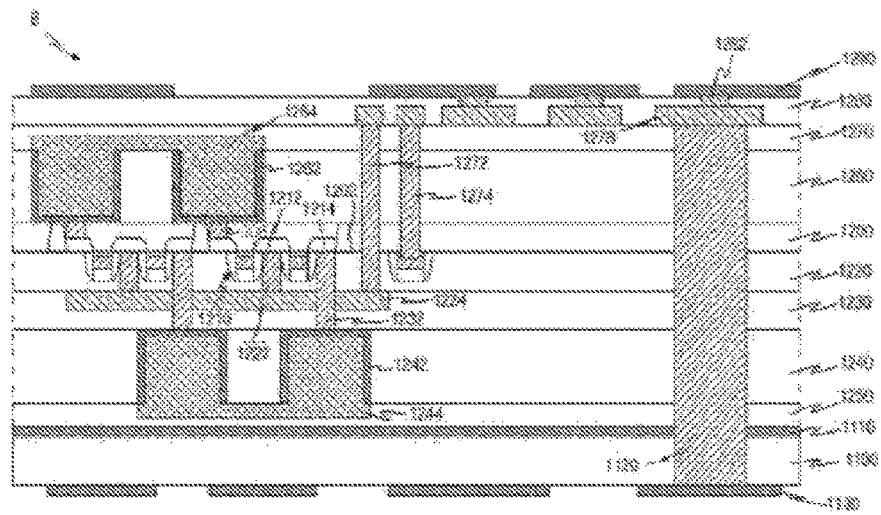

In FIG. 8e, a second semiconductor device B is provided. The second semiconductor device B comprises of a third semiconductor substrate 1100 and bonding layers 1130, 1290 at each of the backside and frontside. The forming method of the second semiconductor device B is similar to that of the first semiconductor device A as described with FIGS. 8a to 8d. The only difference is, in case of the second semiconductor device, bonding layers 1130, 1290 can be formed at top front side of the first data storage devices 1242, 1244 (i.e. backside of the dummy semiconductor substrate 1100) and at top front side of the first data storage devices 1262, 1264.

Figure 8F:
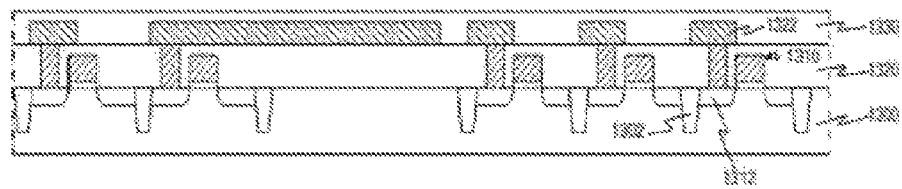

In FIG. 8f, a fourth semiconductor substrate 1300 is provided. The fourth semiconductor substrate 1300 includes logic devices 1310, 1312, 1322. Specifically, the fourth semiconductor substrate 1300 can include transistors 1310, 1312 and wirings 1322 that are connected to the transistors.

Figure 8G:
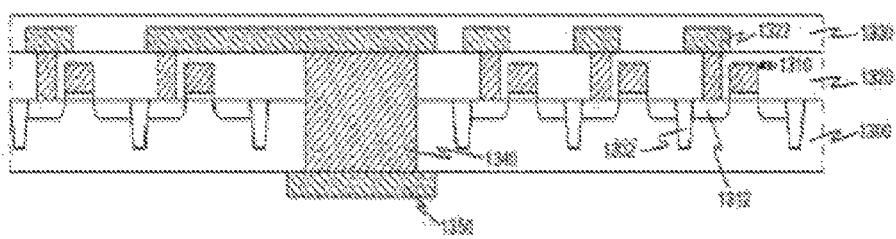

As illustrated in FIG. 8g, contact plugs 1340 are formed to be connected to the wirings 1322 on the fourth semiconductor substrate 1300 from backside of the fourth semiconductor substrate 1300. At this time, the contact plugs 1340 can be formed by penetrating the fourth semiconductor substrate 1300. Wirings 1350 can be formed to be electrically connected to the logic devices 1310, 1312 at the backside of the fourth semiconductor substrate 1300.

Figure 8H:
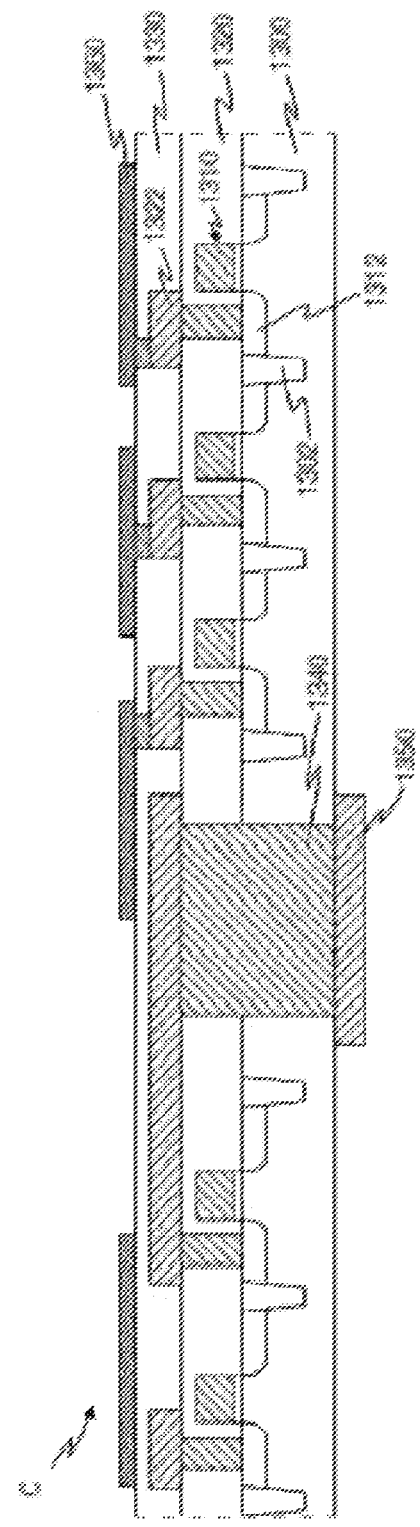

As shown in FIG. 8h, a bonding layer 1360 is formed on top of the fourth semiconductor substrate 1300 for bonding other semiconductor devices A, B. The bonding layer 1360 can be formed with conducting material, and the logic devices 1310, 1312 can be electrically connected to the other semiconductor devices A, B through the bonding layer 1360. This completes formation of a third semiconductor device C which includes logic devices 1310, 1312.

Figure 8I:
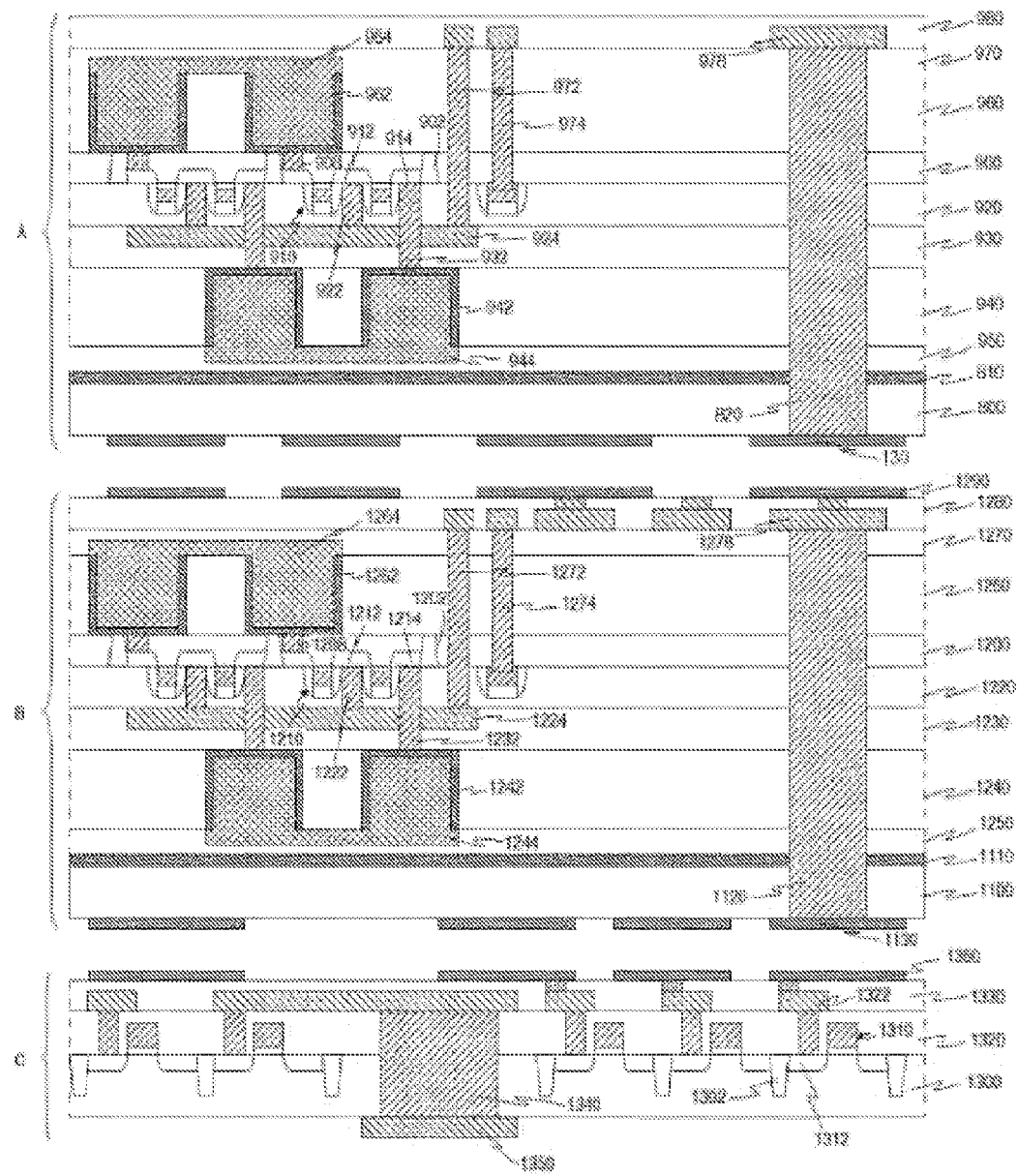

As illustrated in FIG. 8i, the second semiconductor device B is bonded on the third semiconductor device C. Then, the first semiconductor device A is bonded on the second semiconductor device B.

Figure 8J:
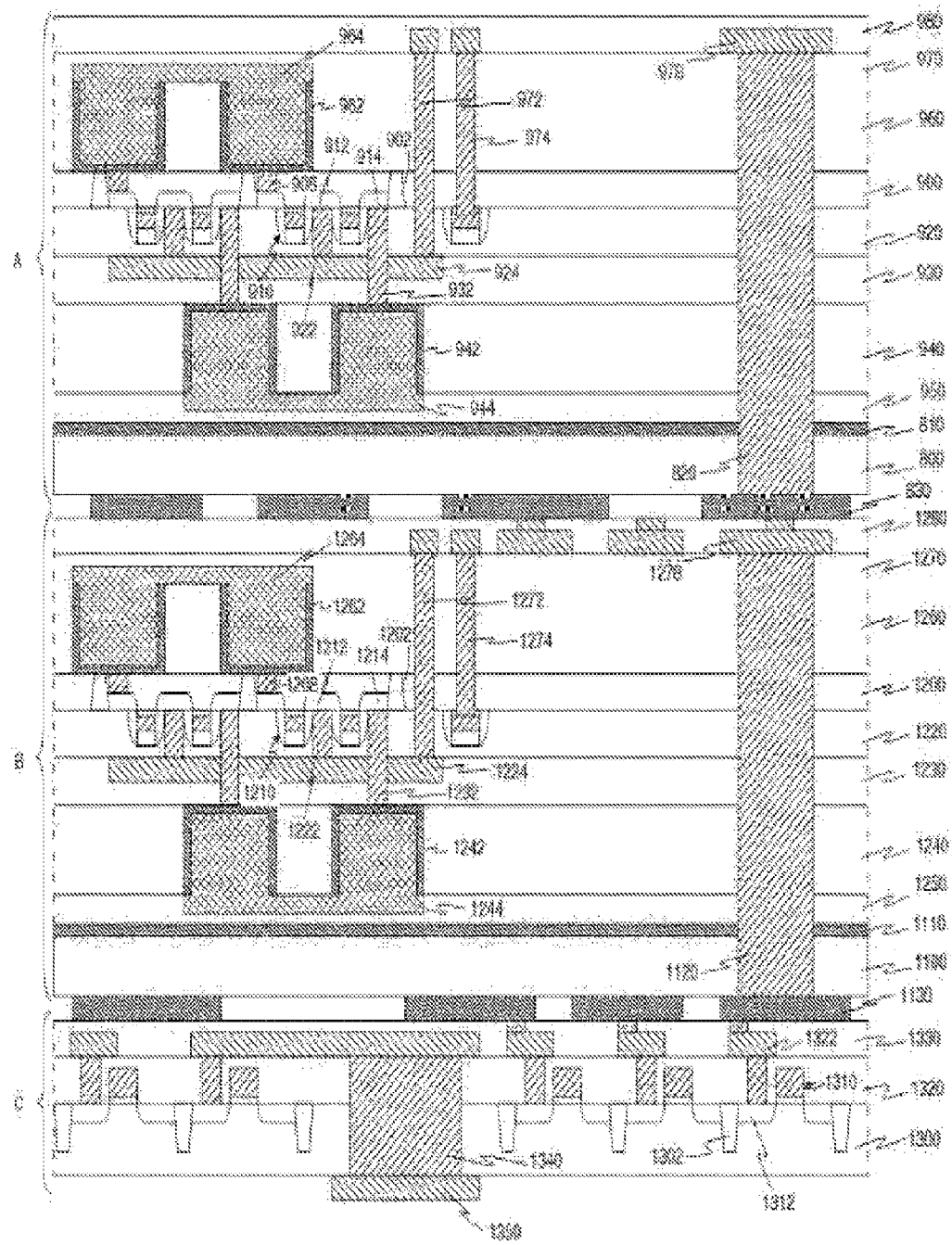

As shown in FIG. 8j, a semiconductor memory device is completed. The semiconductor memory device includes data storage devices and switching devices arranged alternatively on top of the logic devices 1310, 1312. The first, the second and the third semiconductor devices can be electrically connected through the bonding layers 1130, 1290 because the bonding layers 1130, 1290 can be formed with conducting material.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A method for fabricating semiconductor memory device, comprising:
   providing a semiconductor substrate;
   forming a lower region, which includes a first data storage device, wherein the lower region is carried by the semiconductor substrate;
   forming a switching device, which is carried by the first data storage device; and
   forming an upper region, which includes a second data storage device, wherein the upper region is carried by the switching device;
   wherein the step of forming the first storage device includes forming a first electrode having a cylindrical or pillar shape, the first electrode being connected to the switching device.

2. The method of claim 1, wherein the step of forming the first data storage device includes forming a pillar shape pattern by depositing and planarizing an insulation film.

3. The method of claim 2, wherein the step of forming the first data storage device includes forming a first electrode by depositing a first metal and/or first poly-silicon film on the surface of the pillar shape pattern, and the depositing a dielectric film on the surface of the first electrode.

4. The method of claim 3, wherein the step of forming the first data storage device includes forming a second electrode by depositing second metal and/or second poly-silicon film on the surface of the dielectric film.

5. The method of claim 4, wherein the step of forming the first data storage device includes exposing a portion of the dielectric film, and depositing an insulation film on the exposed surface.

6. The method of claim 4, wherein the step of forming the second electrode includes using atomic layer deposition.

7. The method of claim 4, wherein the step of forming the second electrode includes depositing a metal material.

8. The method of claim 4, wherein the step of forming the second electrode includes depositing a poly-silicon material.

9. The method of claim 5, wherein the step of exposing the portion of the dielectric film includes using a spacer etching process.

10. The method of claim 3, wherein the step of depositing the dielectric film includes depositing one of aluminum oxide (Al2O3), hafnium oxide (HfO2) and zirconium oxide (ZrO2).

11. A method fir fabricating a semiconductor memory device, comprising:
    forming a first data storage device;
    coupling a semiconductor substrate to the first data storage device using a bonding layer;
    forming a switching device in response to etching, through the semiconductor substrate; and
    forming a second data storage device, wherein, the second data storage device is spaced from the first data storage device by the switching device.

12. The method of claim 11, wherein the switching device is a vertically oriented semiconductor device.

13. The method of claim 11, further including etching through the bonding, layer to form a first electrode.

14. The method of claim 13, further including forming a second electrode, wherein the second electrode is positioned between the switching device and second data storage device.

15. The method of claim 14, wherein the switching device extends between the first and second cylindrical electrodes.

16. A method for fabricating a semiconductor memory device, comprising:
    forming a first data storage device;
    coupling a semiconductor substrate to the first data storage device using a bonding layer;
    forming a switching device in response to etching through the semiconductor substrate;
    forming a first electrode in response to etching through the bonding layer; and
    forming a second data storage device, wherein the second data storage device is spaced from font the first data storage device by the switching device.

17. The method of claim 16, wherein the step of etching through the semiconductor substrate includes forming a stack of semiconductor layers.

18. The method of claim 17, wherein the stack of semiconductor layers is carried by the first electrode.

19. The method of claim 16, further including, forming a second electrode, wherein the second electrode is positioned between the switching device and second data storage device.

20. The method of claim 14, wherein the s witching device extends between the first and second cylindrical electrodes.

* * * * *